(12) United States Patent
Oh et al.

(10) Patent No.: US 11,107,870 B2
(45) Date of Patent: Aug. 31, 2021

(54) THIN FILM TRANSISTOR SUBSTRATE HAVING TWO DIFFERENT TYPES OF THIN FILM TRANSISTORS ON THE SAME SUBSTRATE AND DISPLAY USING THE SAME

(71) Applicant: LG DISPLAY CO., LTD., Seoul (KR)

(72) Inventors: Saeroonter Oh, Seoul (KR); Jungsun Beak, Gyeonggi-do (KR); Seungmin Lee, Seoul (KR); Juheyuck Baeck, Seoul (KR); Hyunsoo Shin, Gyeonggi-do (KR); Jeyong Jeon, Gyeonggi-do (KR); Dohyung Lee, Seoul (KR)

(73) Assignee: LG Display Co., Ltd, Seoul (KR)

( * ) Notice: Subject to any disclaimer, the term of this patent is extended or adjusted under 35 U.S.C. 154(b) by 0 days.

(21) Appl. No.: 16/221,203

(22) Filed: Dec. 14, 2018

(65) Prior Publication Data
US 2019/0123120 A1  Apr. 25, 2019

Related U.S. Application Data

(62) Division of application No. 14/838,659, filed on Aug. 28, 2015, now Pat. No. 10,181,502.
(Continued)

(30) Foreign Application Priority Data

Aug. 29, 2014  (KR) .................. 10-2014-0114301
Aug. 29, 2014  (KR) .................. 10-2014-0114304
(Continued)

(51) Int. Cl.
*H01L 27/32*  (2006.01)
*H01L 27/12*  (2006.01)
(Continued)

(52) U.S. Cl.
CPC ....... *H01L 27/3262* (2013.01); *G09G 3/3208* (2013.01); *H01L 27/1222* (2013.01);
(Continued)

(58) Field of Classification Search
CPC .............. H01L 27/1251; H01L 27/088; H01L 27/1237; H01L 27/3262; H01L 21/823431;
(Continued)

(56) References Cited

U.S. PATENT DOCUMENTS 9,129,927 B2   9/2015  Gupta et al.
9,515,100 B2   12/2016 Im
(Continued)

FOREIGN PATENT DOCUMENTS

CN    103295962 A    9/2013
WO    2014190712     12/2014

OTHER PUBLICATIONS

Chinese Office Action, dated Oct. 31, 2017, for the corresponding Chinese patent application No. 201510536285.5.
PCT/CN 2013/088826, published Dec. 4, 2014.

*Primary Examiner* — Suberr L Chi
(74) *Attorney, Agent, or Firm* — Morgan, Lewis & Bockius LLP

(57) ABSTRACT

The present disclosure relates to a thin film transistor substrate having two different types of thin film transistors on the same substrate and a display using the same. A disclosed display device may include a substrate, a first thin film transistor including a first semiconductor layer having a polycrystalline semiconductor material on the substrate, and a second thin film transistor including a second semiconductor layer including an oxide semiconductor material
(Continued)

on the substrate. Both the first semiconductor layer and the second semiconductor layer may be disposed directly on a same underlying layer.

19 Claims, 13 Drawing Sheets

Related U.S. Application Data

(60) Provisional application No. 62/043,448, filed on Aug. 29, 2014, provisional application No. 62/043,458, filed on Aug. 29, 2014, provisional application No. 62/043,478, filed on Aug. 29, 2014.

(30) Foreign Application Priority Data

Aug. 29, 2014 (KR) .................. 10-2014-0114308
Aug. 11, 2015 (KR) .................. 10-2015-0113274

(51) Int. Cl.
*G09G 3/3208* (2016.01)
*H01L 51/52* (2006.01)

(52) U.S. Cl.
CPC ...... *H01L 27/1225* (2013.01); *H01L 27/1229* (2013.01); *H01L 27/1237* (2013.01); *H01L 27/1248* (2013.01); *H01L 27/1251* (2013.01); *G09G 2310/0297* (2013.01); *G09G 2320/0247* (2013.01); *G09G 2330/021* (2013.01); *G09G 2340/0435* (2013.01); *H01L 27/322* (2013.01); *H01L 27/3276* (2013.01); *H01L 51/5209* (2013.01); *H01L 51/5225* (2013.01); *H01L 2227/323* (2013.01)

(58) Field of Classification Search
CPC ............. H01L 27/1222; H01L 27/1248; H01L 27/1262
See application file for complete search history.

(56) References Cited

U.S. PATENT DOCUMENTS

| | | |
|---|---|---|
| 2004/0245526 A1 | 12/2004 | Park et al. |
| 2011/0049507 A1 | 3/2011 | Choi |
| 2012/0305910 A1 | 12/2012 | Hsieh et al. |
| 2013/0099220 A1 | 4/2013 | Yeh et al. |
| 2014/0124750 A1* | 5/2014 | Chang .................. H01L 27/3248 257/40 |
| 2014/0353659 A1* | 12/2014 | Park ...................... H01L 27/124 257/43 |
| 2015/0054799 A1 | 2/2015 | Chang et al. |
| 2015/0055047 A1 | 2/2015 | Chang et al. |
| 2015/0055051 A1 | 2/2015 | Osawa et al. |
| 2015/0179679 A1 | 6/2015 | Im |
| 2015/0236079 A1 | 8/2015 | Choi |

* cited by examiner

THIN FILM TRANSISTOR SUBSTRATE HAVING TWO DIFFERENT TYPES OF THIN FILM TRANSISTORS ON THE SAME SUBSTRATE AND DISPLAY USING THE SAME

This application is a Divisional of U.S. patent application Ser. No. 14/838,659, filed Aug. 28, 2015, which claims the benefit of Korea Patent Application Nos. 10-2014-0114301 filed on Aug. 29, 2014, 10-2014-0114304 filed on Aug. 29, 2014, 10-2014-0114308 filed on Aug. 29, 2014, and 10-2015-0113274 filed on Aug. 11, 2015, and of the U.S. Provisional Patent Application Nos. 62/043,448 filed on Aug. 29, 2014, 62/043,458 filed on Aug. 29, 2014, and 62/043,478 filed on Aug. 29, 2014. Each of the above-identified U.S., U.S. Provisional, and Korean Patent Applications is incorporated herein by reference for all purposes as if fully set forth herein.

BACKGROUND OF THE INVENTION

Field of the Invention

The present invention relates to a thin film transistor substrate, and more particularly, to a thin film transistor substrate having two different types of thin film transistors on the same substrate, and a display using the same.

Discussion of the Related Art

As the information society continues to develop, displays for depicting information are increasingly required in various ways to do more. Accordingly, various flat panel displays (or 'FPDs') are developed for overcoming many drawbacks of the cathode ray tube (or 'CRT'), such as heavy weight and large volume. The flat panel displays include liquid crystal displays (or 'LCDs'), plasma display panels (or 'PDPs'), the organic light emitting displays (or 'OLEDs') and electrophoresis displays (or 'EDs').

The display panel of a flat panel display may include a thin film transistor substrate having a thin film transistor in each pixel region arranged in a matrix format. For example, a liquid crystal display (or 'LCD') displays video data by controlling the light transitivity of the liquid crystal layer using the electric fields applied across the liquid crystal layer. An organic light emitting diode display displays the video data by generating properly controlled light at each pixel disposed in a matrix manner as an organic light emitting diode is formed therein.

As a self-emitting display device, the organic light emitting diode display has the advantages of a fast response time, high brightness and a large viewing angle. An organic light emitting diode display (or OLED) using organic light emitting diodes of a high energy efficiency can be categorized as a passive matrix type organic light emitting diode display (or PMOLED) or an active matrix type organic light emitting diode display (or AMOLED).

As the development of personal electronic devices is becoming more active, display devices are being developed as highly portable and/or wearable devices. To incorporate a display device into a portable and/or wearable device, it is typically desirable for the display device to have low power consumption. However, with the conventional display technologies that have been developed to date, there are limitations on reducing power consumption.

SUMMARY OF THE INVENTION

Accordingly, the present invention relates to a thin film transistor substrate and a display using the same that substantially obviate one or more of the problems due to limitations and disadvantages of the related art.

An object of the present invention is to provide a thin film transistor substrate for a flat panel display having at least two different types of transistors with different characteristics on the same substrate.

Another object of the present invention is to provide a thin film transistor substrate for a flat panel display having two different types of transistors manufactured by improved manufacturing processes and a reduced number of mask processes.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a display device includes: a substrate; a first thin film transistor including a first semiconductor layer having a polycrystalline semiconductor material on the substrate; and a second thin film transistor including a second semiconductor layer having an oxide semiconductor material on the substrate, wherein both the first semiconductor layer and the second semiconductor layer are disposed directly on a same underlying layer.

In another aspect, a display device, includes: a substrate; a first gate insulating layer over the substrate; a second gate insulating layer over the substrate; a first thin film transistor including a first semiconductor layer having a polycrystalline semiconductor material on the substrate and a first gate electrode overlapping a portion of the first semiconductor layer, with the first gate insulating layer between the first semiconductor layer and the first gate electrode; and a second thin film transistor including a second semiconductor layer including an oxide semiconductor material on the substrate and a second gate electrode overlapping a portion of the second semiconductor layer, with the second gate insulating layer between the second semiconductor layer and the second gate electrode, wherein both the first gate electrode and the second gate electrode are respectively disposed directly on two separate parts of a same underlying layer.

The thin film transistor substrate and a display using the same according to the present invention comprises two different types of thin film transistors on the same substrate, so that these two different types of thin film transistors can compensate for and complement each other. In particular, by including a thin film transistor having low off-current characteristics, the display can provide for a low frequency driving and low power consumption. Therefore, it is suitable for use in the portable and/or wearable appliances.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate example embodiments of the invention and together with the description serve to explain the principles of the invention. In the drawings.

DETAILED DESCRIPTION OF THE ILLUSTRATED EMBODIMENTS

Figure 1:
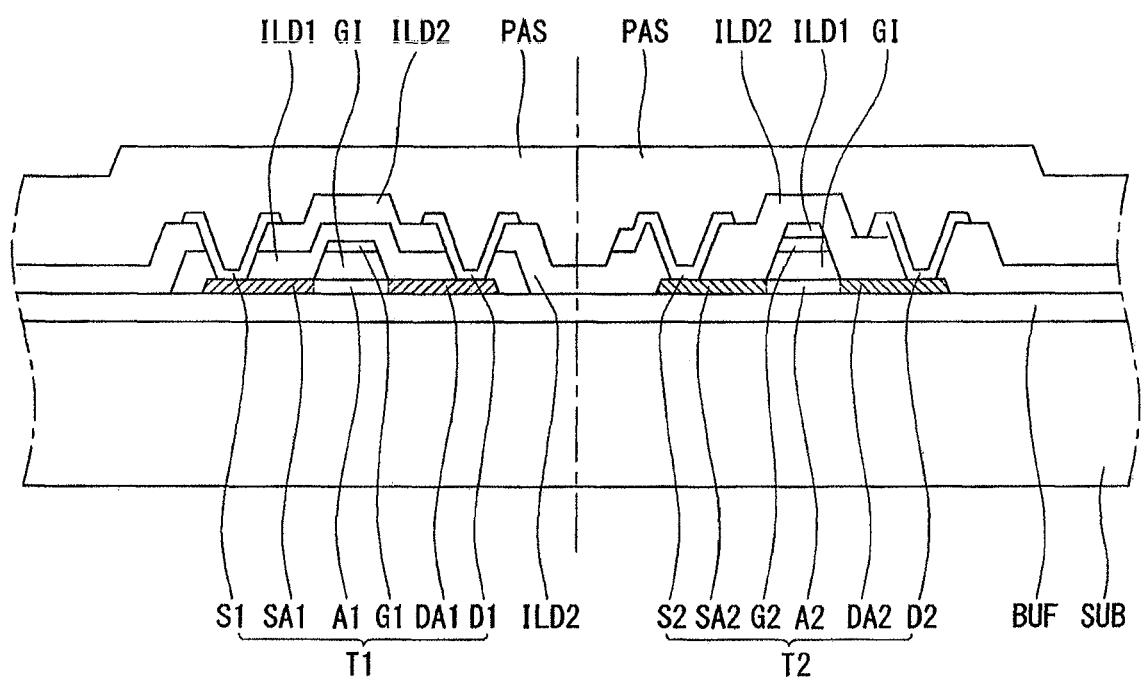
FIG. 1 is a cross sectional view illustrating a structure of a thin film transistor substrate for a flat panel display in which two different types of thin film transistors are formed, according to a first example embodiment of the present invention.

Reference will now be made in detail to the example embodiments of the present invention, which are illustrated in the accompanying drawings. Like reference numerals designate like elements throughout the detailed description. However, the present invention is not restricted by these example embodiments but various changes or modifications can be made without departing from the principle or spirit of the invention. In the following example embodiments, the names of the elements are selected for ease of explanation and may be different from names used in actual products.

As used herein, unless otherwise specified, the term "on" broadly encompasses both "directly on" and "indirectly on". Also, unless otherwise specified, the term "under" broadly encompasses both "directly under" and "indirectly under".

The thin film transistor substrate for a flat panel display according to example embodiments of the present invention may comprise a first thin film transistor disposed in a first area of the substrate and a second thin film transistor disposed in a second area of the same substrate. The substrate may include a display area and a non-display area. In the display area, a plurality of pixel areas is arranged in a matrix format. In a pixel area, display elements for implementing a display function are disposed. In the non-display area neighboring the display area, driver elements for driving the display elements in the display area are disposed.

Here, the first area may be the non-display area, and the second area may be some or all portions of the display area. In this example, the first thin film transistor and the second thin film transistor may be disposed substantially apart from each other. In another example, the first area and the second area may both be included in the display area. In particular, in an example where a plurality of thin film transistors are disposed in one pixel area, the first thin film transistor and the second thin film transistor may be disposed near each other.

As the polycrystalline semiconductor material has the characteristics of high mobility (over 100 $cm^2/Vs$), low power consumption, and high reliability, it may be suitable for use in the thin film transistors in such driver elements as a gate driver and/or a multiplexer (or 'MUX') for driving the display elements. In addition, it may be suitable for use in a driving thin film transistor disposed in the pixel area of an organic light emitting diode display. On the other hand, as the oxide semiconductor material has low off-current, it may be suitable for use in the channel layer of a switching thin film transistor in the pixel area, which typically has a very short ON time period and a long OFF time period. Further, as the off-current is low, the holding time of the pixel voltage may be long. Thus, thin film transistors using the oxide semiconductor material is suitable for use in a display requiring low frequency driving and/or low power consumption. By disposing these two different types of thin film transistors on the same base substrate, the present invention provides a thin film transistor substrate having an optimized function and characteristic for the portable and/or wearable displays.

When a semiconductor layer is formed using the polycrystalline semiconductor material, a doping process and a high temperature treatment process are required. On the other hand, a process for forming a semiconductor layer using the oxide semiconductor material is typically performed at relatively low temperatures. Therefore, the polycrystalline semiconductor layer, typically formed under a more severe heat condition, may be first formed and then the oxide semiconductor layer may be formed. Further, to simplify the manufacturing process, the first thin film transistor having the polycrystalline semiconductor material and the second thin film transistor having the oxide semiconductor material may have the same basic structure. For example, the first gate electrode of the first thin film transistor and the second gate electrode of the second thin film transistor may be formed from the same layer of the same metal material. In addition, the first source and drain electrodes of the first thin film transistor, and the second source and drain electrodes of the second thin film transistor may be made from the same layer of the same metal material. Further, to maintain consistent characteristics of these two different semiconductor materials, both the first and second thin film transistors may have the top-gate structure in which the channel area can be defined relatively precisely.

For ease of reference hereinafter, unless otherwise specified, the first thin film transistor refers to a thin film transistor having a polycrystalline semiconductor material, and the second thin film transistor a thin film transistor having an oxide semiconductor material. For example, the first thin film transistor may be used in the driver elements disposed in the non-display area, and the second thin film transistor may be used in the display elements disposed in the pixel areas of the display area. However, the references to the first and second thin film transistors are not restricted to the above example only. In an example of the organic light emitting diode display, the first thin film transistor and the second thin film transistor may both be disposed in a pixel area of the display area. In particular, the first thin film transistor having the polycrystalline semiconductor material may be used as the driving thin film transistor, and the second thin film transistor having the oxide semiconductor material may be used the switching thin film transistor.

Moreover, when a gate driving circuit (or, a gate driver) is disposed within the non-display area of the substrate, the gate driver may include C-MOS type thin film transistors having the polycrystalline semiconductor material. In other words, P-MOS type thin film transistors and N-MOS type thin film transistors both having the poly crystalline semiconductor layers may be incorporated in the gate driver disposed in the non-display area. In that case, to form a low density doping area (or an LDD area) for the N-MOS type thin film transistors, many mask processes may be required. Here, the N-MOS type thin film transistor having the poly crystalline semiconductor material may be replaced with a thin film transistor having an oxide semiconductor material so that the LDD area may not be required, and the number of mask processes can be simplified and/or reduced.

First Embodiment

The first example embodiment of the present invention is discussed with reference to FIG. 1. FIG. 1 is a cross sectional view illustrating a structure of a thin film transistor substrate for a flat panel display in which two different types of thin film transistors are formed, according to the first example embodiment of the present invention. Here, the cross sectional views are more often referenced mainly because they more clearly show features of the example embodiments of the present invention than plane views.

As shown in FIG. 1, the thin film transistor substrate for a flat panel display according to the first example embodiment comprises a first thin film transistor T1 and a second thin film transistor T2, which are disposed on the same base substrate SUB. The base substrate SUB may hereinafter be referred to as the substrate SUB or the substrate. The first and second thin film transistors T1 and T2 may be disposed substantially far apart from each other, or they may be disposed near each other. Moreover, these two thin film transistors may be disposed as to overlap each other.

On the whole surface of the substrate SUB, a buffer layer BUF may be deposited. In some cases, the buffer layer BUF may not be included. Further, the buffer layer BUF may include a plurality of layers. Here, for ease of reference, the buffer layer BUF is referred to as a single layer. Further, a light shield layer may be included between the substrate SUB and the buffer layer BUF at some areas on the substrate SUB. The light shield layer may be further disposed to prevent light from entering into the semiconductor layer of the thin film transistors disposed thereon.

On the buffer layer BUF, a first semiconductor layer is disposed where the first thin film transistor T1 is located. For examples where the first thin film transistor T1 is used in driver elements, the semiconductor layer may have characteristics of high switching speed and lower power consumption. For example, a P-MOS type or N-MOS type thin film transistor may be used, or a C-MOS type transistor may be used for the first thin film transistor T1. The P-MOS, N-MOS and/or C-MOS type thin film transistor may have a polycrystalline semiconductor material, such as polycrystalline silicon (p-Si). The first semiconductor layer includes a first channel area A1 of the first thin film transistor T1. The first channel area A1 may be defined as the area of the first semiconductor layer overlapped by the first gate electrode G1. As the first gate electrode G1 overlaps the middle portion of the first semiconductor layer, the middle portion of the first semiconductor layer may be defined as the first channel area A1.

Further, on the buffer layer BUF, a second semiconductor layer is disposed where the second thin film transistor T2 is located. The second semiconductor layer includes the second channel area A2 of the second thin film transistor T2. For example, the second semiconductor layer may include an oxide semiconductor material, such as an indium gallium zinc oxide (or "IGZO"), an indium gallium oxide (or "IGO"), or an indium zinc oxide (or "IZO"). The oxide semiconductor material has a relatively low off-current such that the pixels may hold the pixel voltage for long periods. Thus, thin film transistors with oxide semiconductor materials are suitable for displays requiring low frequency driving and/or low power consumption.

The second semiconductor layer comprises the second channel area A2 included in the second thin film transistor T2. The second channel area A2 may be defined as the area of the second semiconductor layer under the second gate electrode G2. As the second gate electrode G2 overlaps the middle portion of the second semiconductor layer, the middle portion of the second semiconductor layer may be defined the second channel area A2.

The first semiconductor layer has the polycrystalline semiconductor material, and the second semiconductor layer has the oxide semiconductor material. The process for forming the polycrystalline semiconductor layer requires a higher temperature environment than that for forming the oxide semiconductor layer. Therefore, the polycrystalline semiconductor layer may be formed first and then the oxide semiconductor layer may be formed.

In the first semiconductor layer including the polycrystalline semiconductor material, the side portions at each side of the first channel area A1 may be doped with the impurities so that they can each establish an ohmic contact with the source or drain electrode. With a photoresist remaining after the first gate electrode G1 is patterned as a mask, the impurities can be doped into the first semiconductor layer so that one of the side portions can be defined as a first source area SA1 and the other side portion can be defined as a first drain area DA1.

In the second semiconductor layer including the oxide semiconductor material, the side portions at each side of the second channel area A2 are treated to become conductive so that ohmic contacts with the source and drain electrodes can be respectively established. When the second gate electrode G2 is patterned, the side portions at both sides of the second channel area A2 are made conductive so that one side portion can be defined as a second source area SA2 and the other side portion can be defined as a second drain area DA2.

The first channel area A1 and the second channel area A2 respectively overlap with the first gate electrode G1 and the second gate electrode G2, with the gate insulating layer GI respectively therebetween. Where the first thin film transistor T1 is disposed, a first intermediate insulating layer ILD1 is formed in an island shape on the first gate electrode G1 and the first semiconductor layer, and may have a similar size as the first semiconductor layer. The first intermediate insulating layer ILD1 may include a silicon nitride material which is suitable for use in a hydrogenation process for the first semiconductor layer including the polycrystalline semiconductor material.

In the area where the second thin film transistor T2 is disposed, a first intermediate insulating layer ILD1 is formed on the second gate electrode, and may have a similar size as the second gate electrode G2. In other words, the first intermediate insulating layer ILD1 is separated from the second semiconductor layer including the oxide semiconductor material by a distance related to the thickness of at least the second gate electrode G2. Therefore, in the hydrogenation process, the hydrogen particles radiated from the first intermediate insulating layer ILD1 cannot be easily diffused into the oxide semiconductor material.

On the first intermediate insulating layer ILD1, a second intermediate insulating layer ILD2 is deposited to cover the whole surface of the substrate SUB. The second intermediate insulating layer ILD2 may have an oxide layer that does not include a significant amount of the hydrogen particles.

On the second intermediate insulating layer ILD2, a first source electrode S1, a first drain electrode D1, a second source electrode S2, and a second drain electrode D2 are disposed.

The first source electrode Si and the first drain electrode D1 contact the first source area SA1 and the first drain area DA1, respectively, through corresponding contact holes penetrating the second intermediate insulating layer ILD2 and the first intermediate insulating layer ILD1. The second source electrode S2 and the second drain electrode D2 contact the second source area SA2 and the second drain area DA2, respectively, through other corresponding contact holes penetrating the second intermediate insulating layer ILD2. The first thin film transistor T1 and the second thin film transistor T2 are completed.

Then, on the whole surface of the substrate SUB having the first thin film transistor T1 and the second thin film transistor T2, a passivation layer PAS is deposited. Further, by patterning the passivation layer PAS, contact holes for exposing the first drain electrode D1 and/or the second drain electrode D2 may be formed. In addition, on the passivation layer PAS, a pixel electrode (or an anode electrode for the organic light emitting diode display) may be included to connect to the first drain electrode D1 and/or second drain electrode D2. Here, for convenience, only the respective structures of the first and second thin film transistors T1 and T2 are illustrated.

When two different types of thin film transistors having different characteristics on the same substrate, the polycrystalline semiconductor layer may be formed first, and then the oxide semiconductor layer may be formed so that the characteristics of both types of semiconductor layers can be better maintained. By forming two different semiconductor layers in separated processes, it is possible to form two different types of thin film transistors with the similar basic structure on the same substrate. Therefore, most of the respective components of the first thin film transistor T1 and the second thin film transistor T2 can be formed from the same layer with the same material. As the result, the manufacturing process can be simplified, the manufacturing tact time can be reduced, and the manufacturing cost can be saved.

Figure 2:
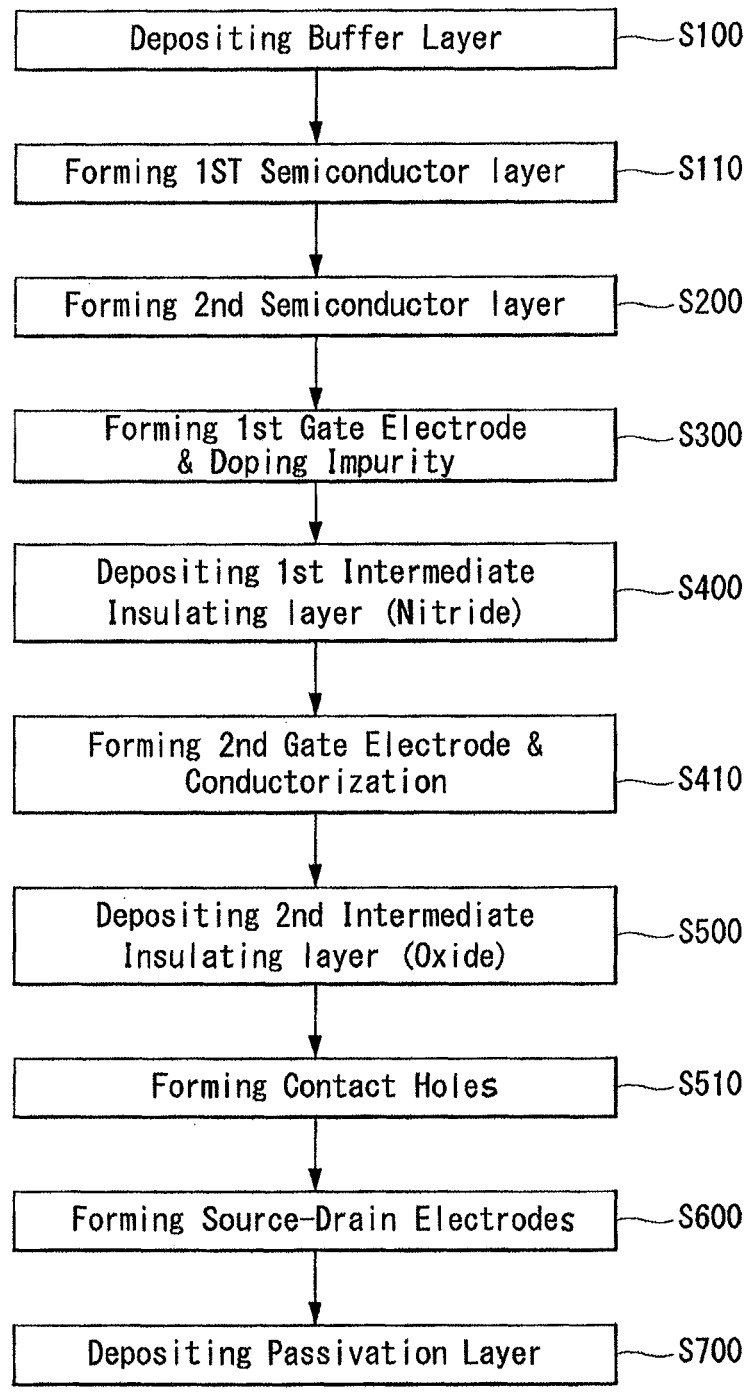
FIG. 2 is a flow chart illustrating a method for manufacturing the thin film transistor substrate for a flat panel display in which two different types of thin film transistors are formed, according to the first example embodiment of the present invention.

Hereinafter, with reference to FIG. 2, the manufacturing method for the thin film transistor substrate of the flat panel display including two different types of thin film transistors on the same substrate is discussed. FIG. 2 is a flow chart illustrating a method for manufacturing a thin film transistor substrate having two different types of thin film transistors according to the first example embodiment of the present invention.

In step S100, on a base substrate SUB, a buffer layer BUF is deposited. Even though it is not shown in figures, before depositing the buffer layer BUF, a light shield layer may be formed on the substrate SUB at desired areas.

In step S110, on the buffer layer BUF, an amorphous silicon (a-Si) material is deposited. A crystallization process is performed to convert the amorphous silicon material into a polycrystalline silicon (poly-Si) material. With a first mask process, the polycrystalline silicon material is patterned to form a first semiconductor layer.

In step S200, on the buffer layer BUF having the first semiconductor layer thereon, a metal oxide semiconductor material is deposited. With a second mask process, the oxide semiconductor material is patterned to form a second semiconductor layer.

In step S300, an insulating material is deposited on the whole surface of the substrate SUB having the first semiconductor layer and the second semiconductor layer to form a gate insulating layer GI. The gate insulating layer GI may include a silicon oxide. Further, the gate insulating layer GI may have a thickness of 1,000 Å or more and 2,000 Å or less. Then, a gate metal material is deposited on the gate insulating layer GI. The gate metal material is patterned with a third mask process to form a first gate electrode G1. Further, at the area where the second semiconductor layer is formed, a capping layer (not shown in the figures) having a larger size than the second semiconductor layer may be formed to cover the second semiconductor layer entirely.

With the first gate electrode G1 and the capping layer serving as a mask, the impurities are doped into the first semiconductor layer. As the first gate electrode G1 overlaps the middle portion of the first semiconductor layer, the impurities are doped into the side portions at both sides of the middle portion. As a result, in the first semiconductor layer, the first channel area A1, the first source area SA1, and the first drain area DA1 are defined. As the capping layer covers whole area of the second semiconductor layer, the impurity materials are not doped into the second semiconductor layer.

In step S400, on the whole surface of the substrate SUB having the first gate electrode G1 and the capping layer, an insulating material such as the silicon nitride is deposited. A nitride layer such as the silicon nitride may have a large amount of hydrogen particles during the depositing process. A post-thermal process may cause a significant amount of hydrogen particles to be diffused into the first semiconductor layer. As a result, the vacancies existing in the polycrystalline semiconductor material of the first semiconductor layer can be filled with the hydrogen particles so that the characteristics of the polycrystalline material can be stabilized and/or enhanced.

In the step of S410, the insulating material (e.g., the nitride layer) and the capping layer are patterned with fourth mask process to form the first intermediate insulating layer ILD1. In the area where the first thin film transistor T1 is disposed, the first intermediate insulating layer ILD1 (e.g., the nitride layer) covers the first semiconductor layer entirely. On the other hand, in the area where the second thin film transistor T2 is disposed, the nitride layer is patterned to form the first intermediate insulating layer ILD1, and the capping layer is patterned to form a second gate electrode G2. As a result, the gate insulating layer GI, the second gate electrode G2, and the first intermediate insulating layer ILD1 have a similar shape and are stacked on the middle portion of the second semiconductor layer. During the process of forming the second gate electrode G2, both side portions of the second semiconductor layer are exposed. During this process, the two exposed side portions of the second semiconductor layer are made conductive so that the second channel area A2, the second source area SA2, and the second drain area DA2 are defined.

In step S500, on the whole surface of the substrate SUB having the first gate electrode G1 and the second gate electrode G2, a second intermediate insulating layer ILD2 is deposited. The second intermediate insulating layer ILD2 may include a nitride layer and/or an oxide layer. In view of the manufacturing process, the total thickness of the second intermediate insulating layer ILD2 may be between 2,000 Å and 6,000 Å.

In step S510, with a fifth mask process, the second intermediate insulating layer ILD2 and the first intermediate insulating layer ILD1 are patterned to form contact holes for exposing the first source area SA1, the first drain area DA1, the second source area SA2, and the second drain area DA2. These contact holes are for respectively connecting the source and drain electrodes to the source and drain areas in subsequent process steps.

In step S600, a source-drain metal material is deposited on the second intermediate layer ILD2 having the contact holes. With a sixth mask process, the source-drain metal material is patterned to form a first source electrode S1, a first drain electrode D1, a second source electrode S2, and a second drain electrode D2. The first source electrode S1 contacts the first source area SA1. The first drain electrode D1 contacts the first drain area DA1. The second source electrode S2 contacts the second source area SA2. The second drain electrode D2 contacts the second drain area DA2.

In step S700, on the whole surface of the substrate SUB having the source and drain electrodes, a passivation layer PAS is deposited. Even though not shown in the figures, the passivation layer PAS may be patterned to form contact holes for exposing portions of the first and/or second drain electrodes D1 and/or D2.

In the first embodiment of the present invention, the first gate electrode G1 and the second gate electrode G2 are formed on the same layer with the same material. However, they are made in different mask processes. For example, the first gate electrode G1 is formed first. At this time, a capping layer sufficiently large to cover the second semiconductor layer entirely is formed at the area where the second gate electrode G2 will be formed. Then, the impurities are doped into the first semiconductor layer made of a polycrystalline semiconductor material with the first gate electrode G1 serving as a mask. As a result, the first channel area A1, the first source area SA1, and the first drain area DA1 are defined.

Then, the capping layer is patterned to form the second gate electrode G2 in a subsequent mask process. During that process, the first gate insulating layer GI is patterned to have a similar size as the second gate electrode G2. Also in this process, both side portions of the second semiconductor layer made of the oxide semiconductor material are made conductive. As the result, in the second semiconductor layer, the second channel area A2, the second source area SA2 and the second drain area DA2 are defined.

In the first example embodiment, two different types of thin film transistors are formed on the same substrate and to have the same basic structure. Further, most of the elements of one of the two thin film transistors are disposed on the same layer of the same material as the corresponding elements of the other thin film transistor.

Second Example Embodiment

Figure 3:
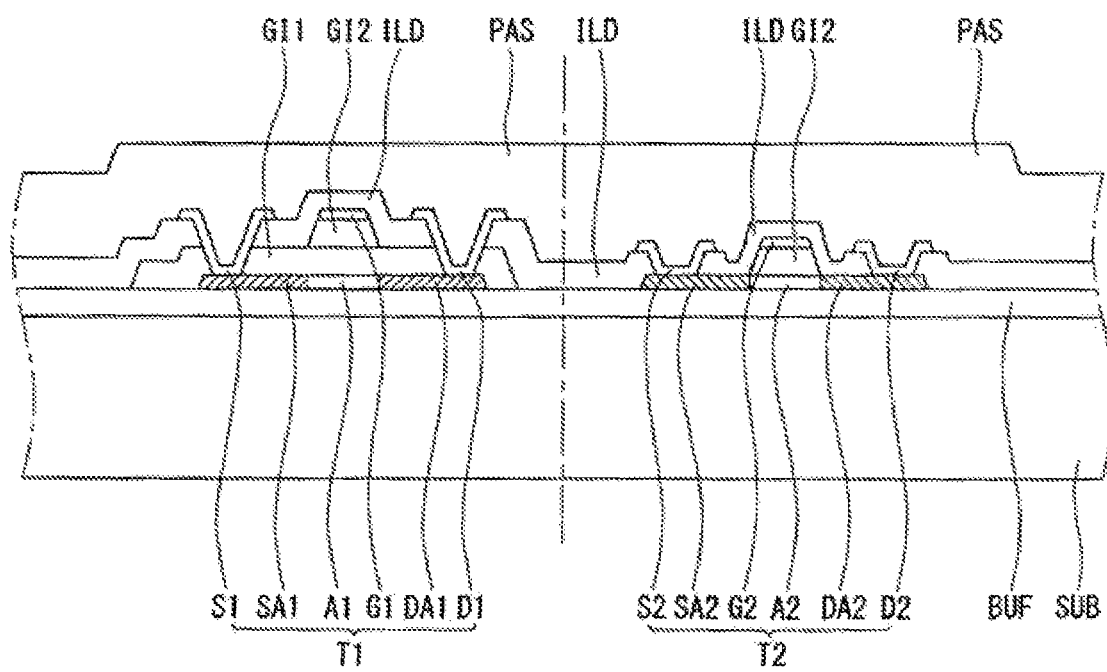
FIG. 3 is a cross sectional view illustrating a structure of a thin film transistor substrate for a flat panel display in which two different types of thin film transistors are formed, according to a second example embodiment of the present invention.

Hereinafter, with reference to FIG. 3, the second example embodiment of the present invention is discussed. FIG. 3 is a cross sectional view illustrating a structure of a thin film transistor substrate for a flat panel display in which two different types of thin film transistors are formed, according to the second example embodiment of the present invention.

In the first example embodiment, two intermediate insulating layers are separately deposited so that the doping process can be applied to the polycrystalline semiconductor material to form a channel area, and the conductorization process can be applied to the oxide semiconductor material to form another channel area. A conductorization process, as used herein, refers to any known process for making an oxide semiconductor material conductive. In the second embodiment, two separate gate insulating layers are used so that the doping process can be applied to the polycrystalline semiconductor material to form a channel area, and the conductorization process can be applied to the oxide semiconductor material to form each channel area.

As shown in FIG. 3, the thin film transistor substrate according to the second example embodiment of the present invention includes a first thin film transistor T1 and the second thin film transistor T2 disposed on the same base substrate SUB. The first and second thin film transistors T1 and T2 may be disposed substantially far apart from each other, or they may be disposed near each other. Further, these two thin film transistors may be disposed as overlapping each other.

On the whole surface of the base substrate SUB, a buffer layer BUF may be deposited. The buffer layer BUF may have the same structure as discussed in the context of the first example embodiment. Similarly, the elements having substantially the same structures or features as those already discussed above with respect to another example embodiment may not be discussed in detail again below.

On the buffer layer BUF, a first semiconductor layer including a polycrystalline semiconductor material is disposed. On the buffer layer BUF, at the same layer level as the first semiconductor layer, a second semiconductor layer including an oxide semiconductor material is disposed.

On the first semiconductor layer, only at the area where the first thin film transistor T1 is to be disposed, a first gate insulating layer GI1 is disposed. However, on the second semiconductor layer, the first gate insulating layer GI1 is not disposed. The first gate insulating layer GI1 may include an oxide layer such as silicon oxide (SiOx). In view of the stability and the characteristics of the element, the first gate insulating layer GI1 may have a thickness between 1,000 Å and 2,000 Å.

In the area where the first thin film transistor T1 is disposed, the second gate insulating layer GI2 and the first gate electrode G1 are stacked on the first gate insulating layer GI1 to overlap the middle portion of the first semiconductor layer. The impurities are doped into the first semiconductor layer with the first gate electrode G1 serving as a doping mask. As a result, the area of the first semiconductor layer overlapped by the first gate electrode G1 is defined as the first channel area A1. The impurity doped areas of the first semiconductor layer at both sides of the first channel area A1 are defined as the first source area SA1 and the first drain area DA1, respectively.

In the area where the second thin film transistor T2 is disposed, the second gate insulating layer GI2 and the second gate electrode G2 are formed on and overlap the middle portion of the second semiconductor layer. The middle portion of the second semiconductor layer overlapping with the second gate electrode G2 is defined as a second channel area A2. The side portions of the second semiconductor material at both sides of the second channel area A2 are made conductive and are defined as a second source area SA2 and a second drain area DA2, respectively.

An intermediate insulating layer ILD is deposited to cover the whole surface of the substrate SUB having the first gate electrode G1 and the second gate electrode G2. In view of the manufacturing processes, the total thickness of the intermediate insulating layer ILD may be between 2,000 Å and 6,000 Å.

On the intermediate insulating layer ILD, the source and drain electrodes are disposed. For example, a first source electrode S1 and a first drain electrode D1 of the first thin film transistor T1 and a second source electrode S2 and a second drain electrode D2 of the second thin film transistor T2 may be formed. The first source electrode S1 contacts the first source area SA1 through a contact hole penetrating the intermediate insulating layer ILD and the first gate insulating layer GI1. The first drain electrode D1 contacts the first drain area DA1 through another contact hole penetrating the intermediate insulating layer ILD and the first gate insulating layer GI1. Further, the second source electrode S2 contacts the second source area SA2 through a contact hole penetrating the intermediate insulating layer ILD. The second drain electrode D2 contacts the second drain area DA2 through another contact hole penetrating the intermediate insulating layer ILD.

On the source and drain electrodes, a passivation layer PAS may be deposited to cover the whole surface of the substrate SUB. When two different types of thin film transistors having different characteristics are formed on the same substrate, the polycrystalline semiconductor layer may be formed first, and then the oxide semiconductor layer may be formed so that the characteristics of both thin film transistors can be better maintained. Further, the gate electrodes of both thin film transistors can be formed concurrently on the same layer level with the same material, and the source and drain electrodes of both thin film transistors can be formed concurrently on the same layer level with the same material. Therefore, the structure of the thin film transistors and the manufacturing process can be simplified.

Figure 4:
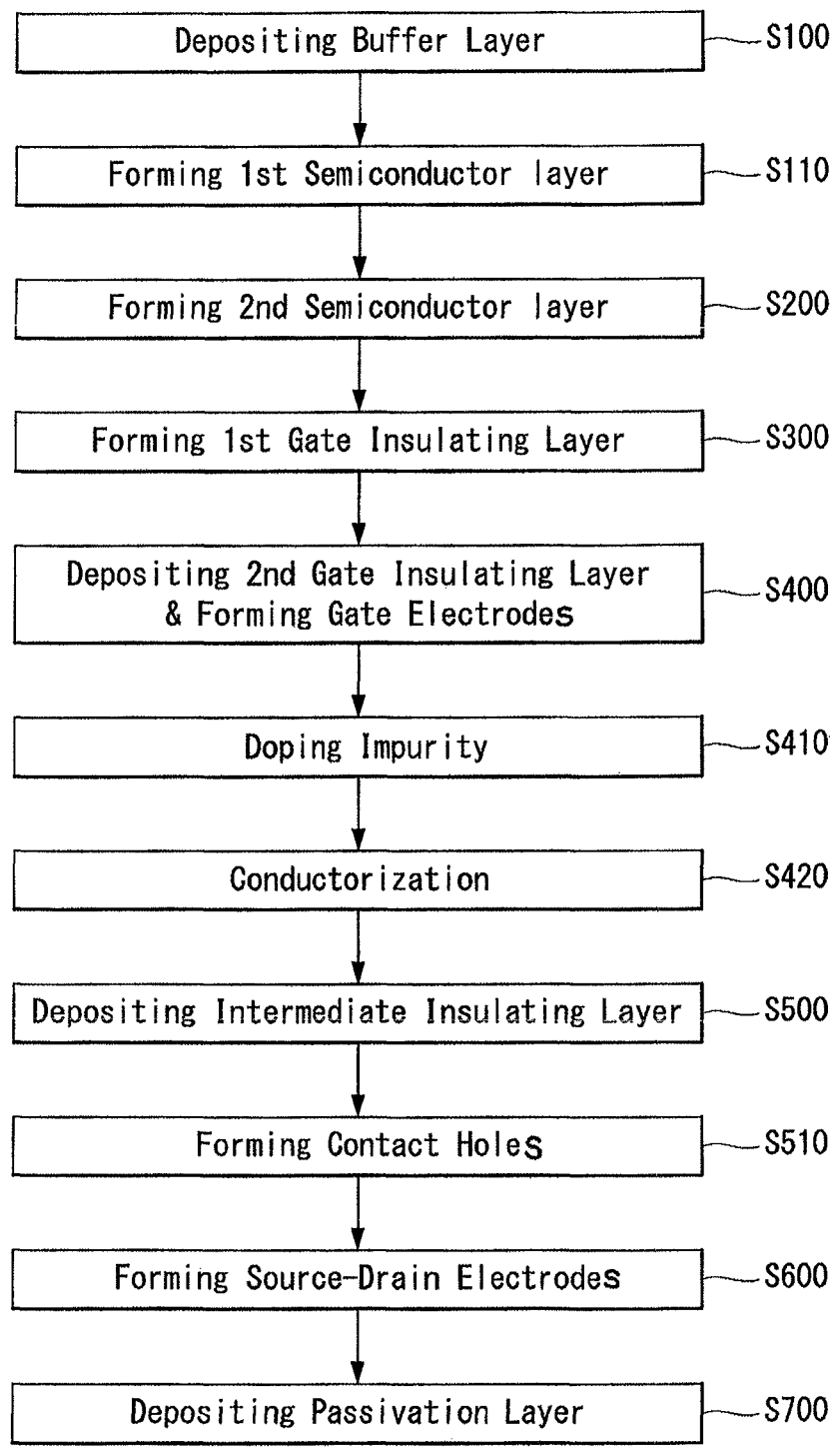
FIG. 4 is a flow chart illustrating a method for manufacturing the thin film transistor substrate for a flat panel display in which two different types of thin film transistors are formed, according to the second example embodiment of the present invention.

Hereinafter, with reference to FIG. 4, the method for manufacturing the thin film transistor substrate for a flat panel display according to the second example embodiment of the present invention is discussed. Again, the features and structures already discussed above may not be discussed again in detail below. FIG. 4 is a flow chart illustrating a method for manufacturing the thin film transistor substrate for a flat panel display in which two different types of thin film transistors are formed on the same substrate, according to the second example embodiment of the present invention.

In step S100, on a base substrate SUB, a buffer layer BUF may be deposited. Even though not shown in the figures, a light shield layer may be formed at desired areas on the substrate SUB before the buffer layer BUF is deposited.

In step S110, on the buffer layer BUF, an amorphous silicon (a-Si) material is deposited. A crystallization process is performed to convert the amorphous silicon material into a polycrystalline silicon (poly-Si) material. With a first mask process, the polycrystalline silicon layer is patterned to form a first semiconductor layer A1.

In step S200, on the buffer layer BUF, an oxide semiconductor material is deposited. The oxide semiconductor material may include at least one of the indium gallium zinc oxide (IGZO), the indium gallium oxide (IGO), and the indium zinc oxide (IZO). The oxide semiconductor material is patterned with a second mask process to form a second semiconductor layer.

In step S300, on the whole surface of the substrate SUB having the first semiconductor layer and the second semiconductor layer, an insulating material, such as the silicon nitride or the silicon oxide, is deposited. The thickness of the insulating material may be between 1,000 Å and 2,000 Å. The insulating material is patterned with a third mask process to form a first gate insulating layer GI1. The first gate insulating layer GI1 may be patterned to cover the first semiconductor layer only. In other words, the first gate insulating layer GI1 may be patterned so as not to cover the second semiconductor layer. Here, the first gate insulating layer GI1 may include a nitride layer including a large content of hydrogen particles. In a post thermal process, the hydrogen particles may be selectively diffused into the first semiconductor layer including a polycrystalline semiconductor material. As the nitride layer is disposed only at the first semiconductor layer, no significant amount of the hydrogen particles may be diffused into the second semiconductor layer including an oxide semiconductor material.

In step S400, on the whole surface of the substrate SUB having the first gate insulating layer GI1 at the first thin film transistor T1 only, a second gate insulating layer GI2 is deposited. The gate insulating layer may include an oxide material such as a silicon oxide material. On the second gate insulating layer GI2, a gate metal material is deposited. The gate metal material is patterned with a fourth mask process to form a first gate electrode G1 and a second gate electrode G2. The first gate electrode G1 overlaps the middle portion of the first semiconductor layer. The second gate electrode G2 overlaps the middle portion of the second semiconductor layer.

With the first gate electrode G1 serving as a mask, the impurities are doped into the first semiconductor layer not covered by the first gate electrode G1 so that a first source area SA1 and a first drain area DA1 are defined. The middle portion of the first semiconductor layer covered by the first gate electrode G1 and therefore not doped with the impurities is defined as a first channel area A1. The detailed manufacturing processes for the doping areas may be somewhat different for different types of thin film transistors, e.g., the P-MOS type, N-MOS type, and C-MOS type. For example of the N-MOS type, a high density doping area may be formed first, and then a low density doping area may be formed. The photo-resist pattern for the first gate electrode G1 which has a larger width than the first gate electrode G1 may be used to define the high density doping area. After the photo-resist pattern is removed, the first gate electrode G1 can be used as a mask to define the low density doping area (or "LDD") between the high density doping area and the first gate electrode G1. On the other hand, if a C-MOS type thin film transistor is implemented, the first thin film transistor T1 may be a P-MOS type thin film transistor, and the second thin film transistor T2 may be an N-MOS type thin film transistor.

In step S420, the second gate insulating layer GI2 is patterned with the first gate electrode G1 and the second gate electrode G2 serving as a mask. Then, under the first gate electrode G1 and the second gate electrode G2, the second gate insulating layer GI2 is formed to have substantially the same shape and size as the gate electrodes G1 and G2, respectively. Under the first gate electrode G1 and the second gate insulating layer GI2, the first gate insulating layer GI1 is provided. On the other hand, under the second gate electrode G2 and the second gate insulating layer GI2, the second semiconductor layer is disposed and the gate insulating later GI1 is not provided. Therefore, both side portions of the second semiconductor layer are exposed. At this time, both of the exposed side portions of the second semiconductor layer are made conductive so that a second source area SA2 and a second drain area DA2 are defined in the second semiconductor layer. The middle portion of the second semiconductor layer is defined as a second channel area A2.

In step S500, on the whole surface of the substrate SUB having the first gate electrode G1 and the second gate electrode G2, an intermediate insulating layer ILD is deposited. In view of the manufacturing process, the total thickness of the intermediate insulating layer ILD may be between 2,000 Å and 6,000 Å.

In step S510, the intermediate insulating layer ILD and the first gate insulating layer GI1 are patterned with a fifth mask process to form contact holes. For example, the first source area SA1 and the first drain area DA1 are exposed through the contact holes penetrating the intermediate insulating layer ILD and the first gate insulating layer GI1. The second source area SA2 and the second drain area DA2 are exposed through the contact holes penetrating the intermediate insulating layer ILD.

In step S600, a metal material is deposited on the intermediate insulating layer ILD and patterned with a sixth mask process to form source and drain electrodes. For example, a first source electrode S1, a first drain electrode D1, a second source electrode S2, and a second drain electrode D2 may be formed. The first source electrode S1 contacts the first source area SA1 through a contact hole penetrating the intermediate insulating layer ILD and the first gate insulating layer GI1. The first drain electrode D1 contacts the first drain area DA1 through another contact hole penetrating the intermediate insulating layer ILD and the first gate insulating layer GI1. The second source electrode S2 contacts the second source area SA2 through a contact hole penetrating the intermediate insulating layer ILD. The second drain electrode D2 contacts the second drain area DA2 through another contact hole penetrating the intermediate insulating layer ILD.

In step S700, on the whole surface of the substrate SUB having the source and drain electrodes, a passivation layer PAS is deposited. Even though not shown in the figures, the passivation layer PAS may be patterned to form contact holes for exposing portions of the first and/or second drain electrodes D1 and/or D2.

Third Example Embodiment

Figure 5:
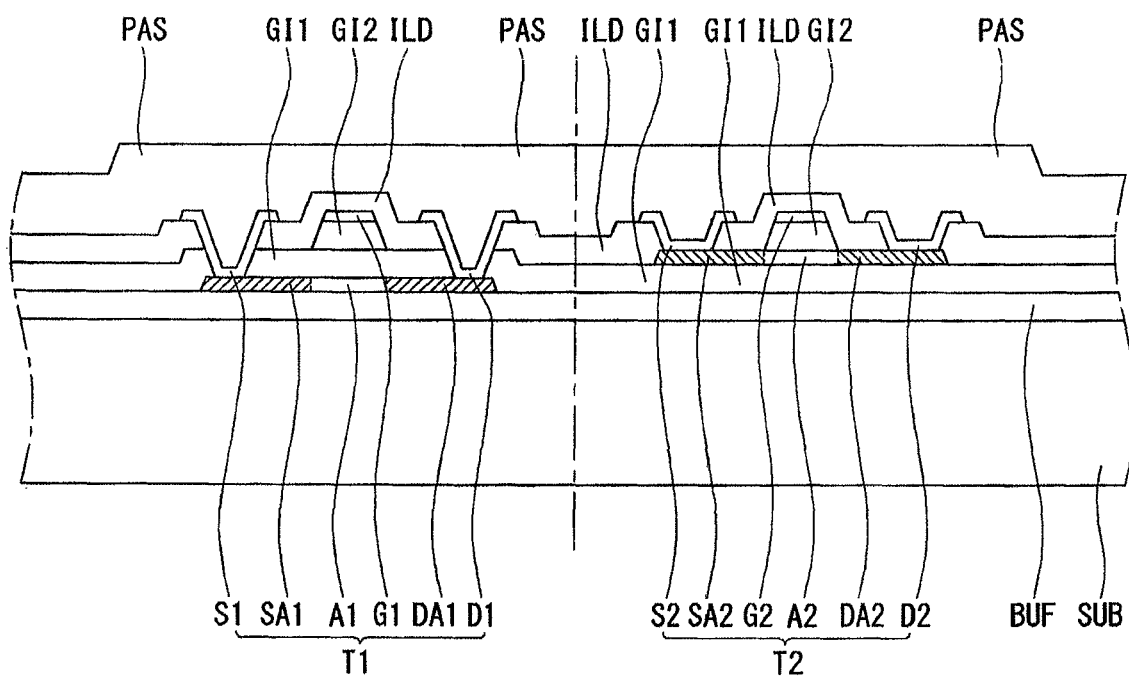
FIG. 5 is a cross sectional view illustrating a structure of a thin film transistor substrate for a flat panel display in which two different types of thin film transistors are formed, according to a third example embodiment of the present invention.

Hereinafter, with reference to FIG. 5, the third example embodiment of the present invention is discussed. FIG. 5 is a cross sectional view illustrating a structure of a thin film transistor substrate for a flat panel display in which two different types of thin film transistors are formed, according to the third example embodiment of the present invention.

With respect to the features of the structure and the manufacturing process, the third example embodiment is very similar with the second example embodiment. For example, two separate gate insulating layers, i.e., the first gate insulating layer GI1 and the second gate insulating layer GI2, are provided. However, in the second example embodiment, the first gate insulating layer GI1 is disposed only in the area where the first thin film transistor T1 is located. In the third example embodiment, however, the first gate insulating layer GI1 is deposited to cover the whole surface of the substrate SUB. Therefore, in the second example embodiment, the first semiconductor layer and the second semiconductor layer are disposed directly on the same layer (directly on the buffer layer BUF). On the other hand, in the third embodiment, the first semiconductor layer is disposed at a different layer level from the second semiconductor layer.

As shown in FIG. 5, on the base substrate SUB, a buffer layer BUF may be deposited. On the buffer layer BUF, a first semiconductor layer including a polycrystalline semiconductor material is disposed. The first semiconductor layer is disposed where the first thin film transistor T1 is to be located. On the first semiconductor layer, a first gate insulating layer GI1 is deposited to cover the whole surface of the substrate SUB.

On the first gate insulating layer GI1, a second semiconductor layer including an oxide semiconductor material is disposed. The second semiconductor layer is disposed where the second thin film transistor T2 is to be located.

Also on the first gate insulating layer GI1, a second gate insulating layer GI2 and the first gate electrode G1 are formed to overlap the middle portion of the first semiconductor layer. The middle portion of the first semiconductor layer overlapping with the first gate electrode G1 is defined as a first channel area A1. The side portions of the first semiconductor layer at both sides of the first channel area A1 are impurity doped areas of the polycrystalline semiconductor material and are defined as a first source area SA1 and a first drain area DA1, respectively.

On the middle portion of the second semiconductor layer, the second gate insulating layer GI2 and the second gate electrode G2 are formed. The middle portion of the second semiconductor layer overlapping with the second gate electrode G2 is defined as a second channel area A2. The side portions of the second semiconductor layer at both sides of the second channel area A2 are the conductive areas of the oxide semiconductor material and are defined as a second source area SA2 and a second drain area DA2, respectively.

On the whole surface of the substrate SUB having the first gate electrode G1 and the second gate electrode G2, an intermediate insulating layer ILD is deposited. In view of the manufacturing process, the total thickness of the intermediate insulating layer ILD may be between 2,000 Å~6,000 Å.

On the intermediate insulating layer ILD, source and drain electrodes are formed. For example, a first source electrode S1 and a first drain electrode D1 of the first thin film transistor T1, and a second source electrode S2 and a second drain electrode D2 of the second thin film transistor T2 may be formed. The first source electrode S1 contacts the first source area SA1 through a contact hole penetrating the intermediate insulating layer ILD and the first gate insulating layer GI1. The first drain electrode D1 contacts the first drain area DA1 through another contact hole penetrating the intermediate insulating layer ILD and the first gate insulating layer GI1. Also, the second source electrode S2 contacts the second source area SA2 through a contact hole penetrating the intermediate insulating layer ILD. The second drain electrode D2 contacts the second drain area DA2 through another contact hole penetrating the intermediate insulating layer ILD.

On the source and drain electrodes, a passivation layer PAS may be deposited to cover the whole surface of the substrate SUB. When two different types of thin film transistors having different characteristics are formed on the same substrate, the polycrystalline semiconductor layer may be formed first, and then the oxide semiconductor layer may be formed so that the characteristics of both thin film transistors can be better maintained. In comparison with the second example embodiment, the first gate insulating layer GI1 is deposited over the whole surface of the substrate SUB and is not patterned to cover only the first semiconductor layer. Therefore, in this respect, the manufacturing process can be more simplified with the third example embodiment.

Figure 6:
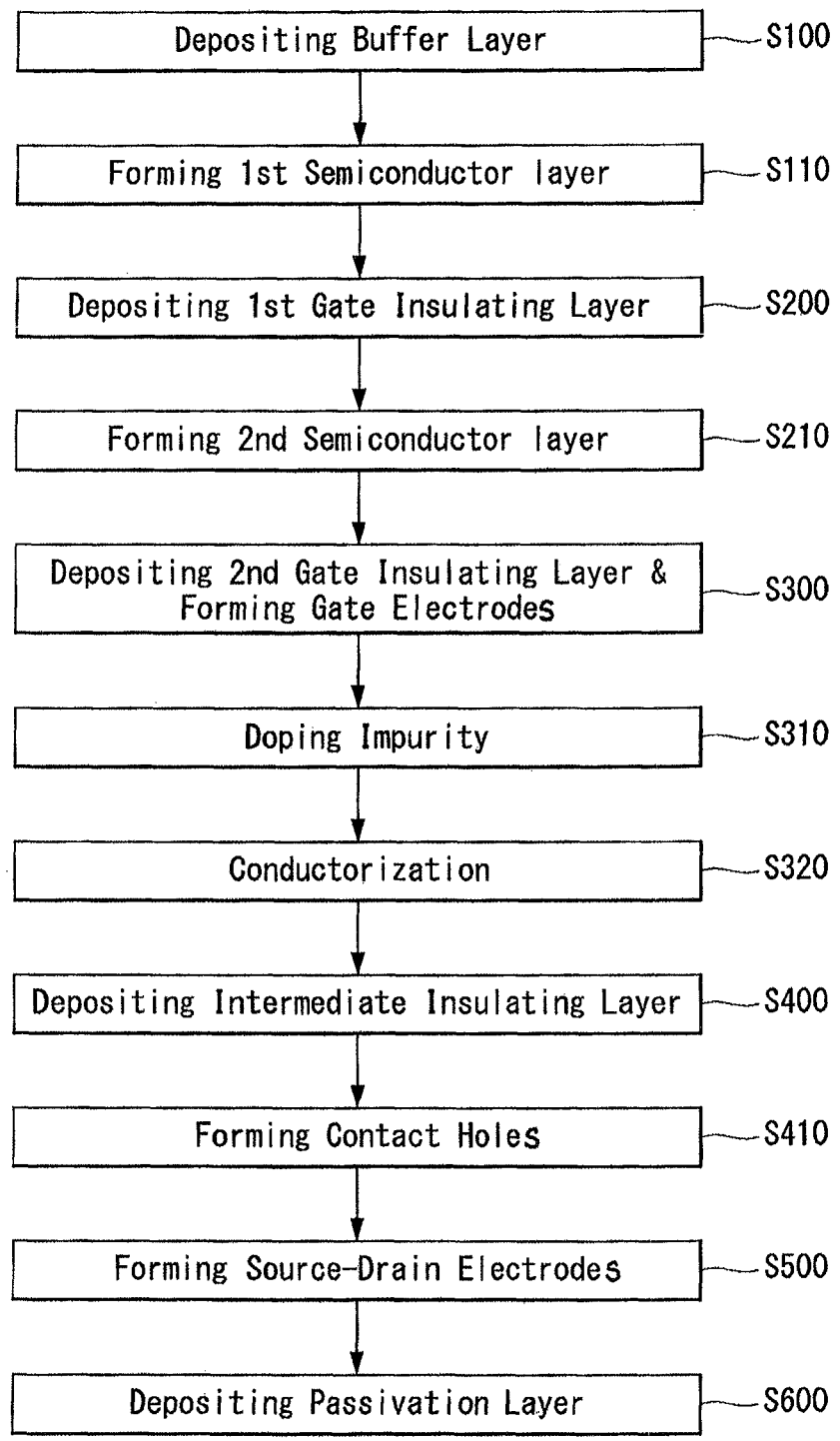
FIG. 6 is a flow chart illustrating a method for manufacturing the thin film transistor substrate for a flat panel display in which two different types of thin film transistors are formed, according to the third example embodiment of the present invention.

Hereinafter, with reference to FIG. 6, the manufacturing method is discussed for the thin film transistor substrate of the flat panel display including two different types of thin film transistors on the same substrate according to the third example embodiment of the present invention. FIG. 6 is a flow chart illustrating a method for manufacturing the thin film transistor substrate having two different types of thin film transistors according to the third example embodiment of the present invention.

In step S100, on a base substrate SUB, a buffer layer BUF may be deposited.

In step S110, on the buffer layer BUF, an amorphous silicon (a-Si) material is deposited. A crystallization process is performed to convert the amorphous silicon material into a polycrystalline silicon (poly-Si) material. With a first mask process, the polycrystalline silicon material is patterned to form a first semiconductor layer.

In step S200, on the substrate SUB having the first semiconductor layer, an oxide material such as a silicon oxide is deposited to form a first gate insulating layer GI1.

In the step of S210, on the first gate insulating layer GI1, a metal oxide semiconductor material is deposited and is patterned with a second mask process to form a second semiconductor layer.

In step 300, on the first semiconductor layer and the second semiconductor layer, an insulating material such as a silicon oxide is deposited for the second gate insulating layer GI2. On the insulating material for the second gate insulating layer GI2, a gate metal material is deposited. The gate metal material is patterned with a third mask process to form a first gate electrode G1 and a second gate electrode G2. The first gate electrode G1 overlaps the middle portion of the first semiconductor layer. The second gate electrode G2 overlaps the middle portion of the second semiconductor layer.

In step S310, the impurities are doped into the semiconductor layers with a first gate electrode G1 and the second gate electrode G2 serving as a mask. In the first semiconductor layer, the middle portion overlapping with the first gate electrode G1 is defined as a first channel area A1. Two side portions of the first semiconductor layer at both sides of the first channel area A1 are defined as a first source area SA1 and a first drain area DA1, respectively. In the second semiconductor layer including the oxide semiconductor material, the impurities are doped into the two side portions of the second semiconductor material at both sides of the second channel area A2 that not covered by the second gate electrode G2. The impurities are for lowering the resistance of the polycrystalline semiconductor material so they have little to no effect on the metal oxide semiconductor material.

In step S320, with the first gate electrode G1 and the second gate electrode G2 serving as a mask, the second gate insulating layer GI2 is patterned. Then, two side portions of the second semiconductor layer which are not covered by the second gate electrode G2 are exposed. These two exposed side portions are made conductive so that a second source area SA2 and a second drain area DA2 are defined, respectively. The middle portion of the second semiconductor layer overlapping with the second gate electrode G2 is defined as a second channel area A2. Here, as the first semiconductor layer is covered by the first gate insulating layer GI1, no portion of the first semiconductor layer is exposed. Therefore, the doped areas of the first semiconductor layer are not damaged by this patterning process.

In step S400, on the whole surface of the substrate SUB having the first gate electrode G1 and the second gate electrode G2, an intermediate insulating layer ILD is deposited. In view of the manufacturing process, the total thickness of the intermediate insulating layer may be between 2,000 Å and 6,000 Å.

In step S410, with a fourth mask process, the intermediate insulating layer ILD and the first gate insulating layer GI1 are patterned to form contact holes. For example, the first source area SA1 and the first drain area DA1 are exposed through contact holes penetrating the intermediate insulating layer ILD and the first gate insulating layer GI1. The second source area SA2 and the second drain area DA2 are exposed through other contact holes penetrating the intermediate insulating layer ILD.

In step S500, a metal material is deposited on the intermediate insulating layer ILD and is patterned with a fifth mask process to form source and drain electrodes. For example, a first source electrode S1, a first drain electrode D1, a second source electrode S2 and a drain electrode D2 may be formed. The first source electrode S1 contacts the first source area SA1 through a contact hole penetrating the intermediate insulating layer ILD and the first gate insulating layer GI1. The first drain electrode D1 contacts the first drain area DA1 through another contact hole penetrating the intermediate insulating layer ILD and the first gate insulating layer GI1. The second source electrode S2 contacts the second source area SA2 through a contact hole penetrating the intermediate insulating layer ILD. The second drain electrode D2 contacts the second drain area DA2 through another contact hole penetrating the intermediate insulating layer ILD.

In step S600, on the whole surface of the substrate SUB having the source-drain electrodes, a passivation layer PAS may be deposited. Even though not shown in the figures, the passivation layer PAS may be patterned to form contact holes for exposing portions of the first and the second drain electrodes D1 and D2.

Fourth Example Embodiment

Figure 7:
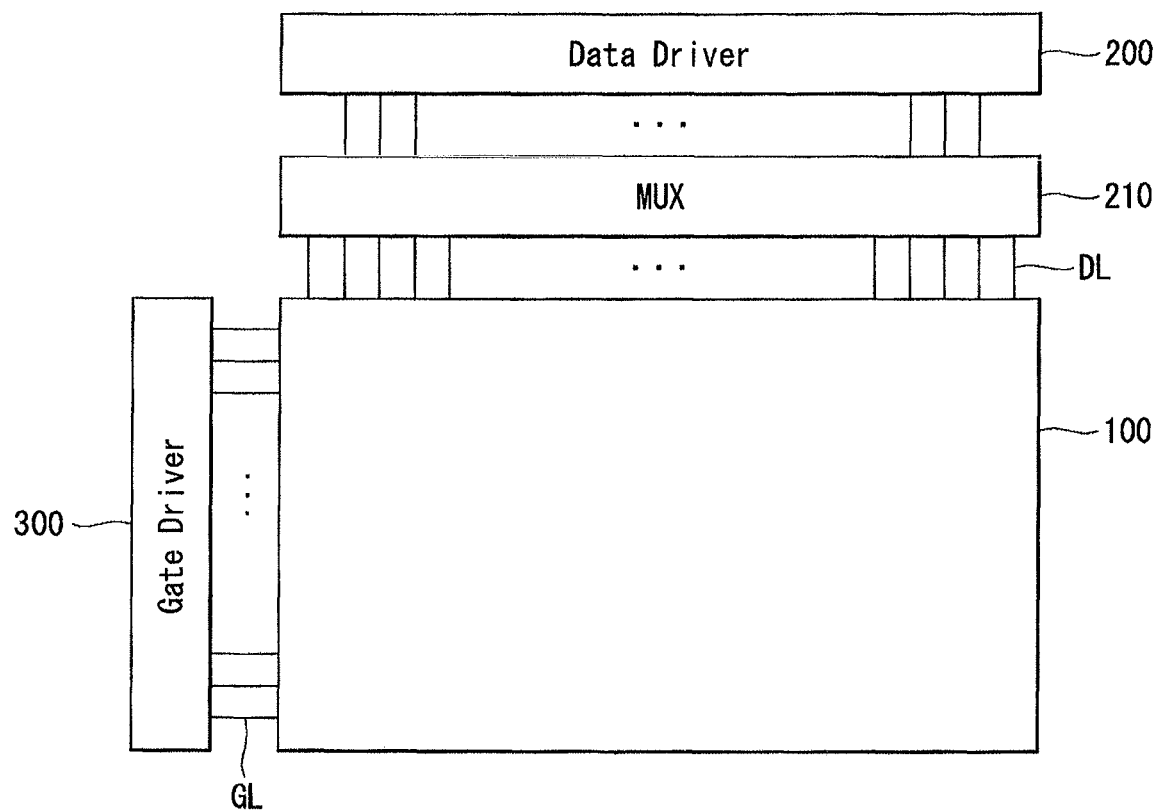
FIG. 7 is a block diagram illustrating a structure of the display according to a fourth example embodiment of the present invention.

The thin film transistor substrate having two different types of thin film transistors or two different types of semiconductor materials on the same substrate, as discussed above, can be applied to various types of displays including a flat panel display, a flexible display and/or a curved display. Various advantages can be obtained by incorporating two different types of thin film transistors on the same substrate. Hereinafter, with reference to FIG. 7, various advanced features and advantages that can be possible or expected from the thin film transistor substrate according to a fifth example embodiment of the present invention are discussed. FIG. 7 is a block diagram illustrating a structure of the display according to the fourth example embodiment of the present invention.

The first and the second transistors T1 and T2 may be formed in each pixel of the display panel 100 for switching the data voltage applied to the pixel or for driving the pixel. For the case of an organic light emitting diode display, the second thin film transistor T2 may be a switch element for the pixel, and the first thin film transistor T1 may be a driver element. However, possible applications are not limited to this particular example. For example, by combining the first and the second thin film transistors T1 and T2, they may be configured to operate as one switch element or one driver element.

For a mobile device or a wearable device, to reduce the power consumption, a relatively low speed driving method using a low frame rate is adopted. In this case, the frame frequency may be lowered for still image and/or the images having a slower update interval. Here, when the lower frame rate is used, at every time the data voltage changes, the brightness of the display may flash. In some cases, as the discharging time interval is elongated, the brightness may flicker at every data update period. By applying the first and the second thin film transistors T1 and T2 on the same substrate according to the present invention, the flicker problem at lower speed driving method can be prevented.

Also, in the lower speed driving method, as the data update period is elongated, the amount of leaked current of the switching thin film transistor may increase. The leaked current of the switching thin film transistor may cause a drop in the voltage of the storage capacitance and/or in the voltage between the gate and source of the driving thin film transistor. The second thin film transistor having the oxide semiconductor material can be used as the switching thin film transistor of the organic light emitting diode display. As a thin film transistor including an oxide semiconductor material has relatively low off-current characteristics, the drop in the voltage of the storage capacitance and/or in the gate-source voltage of the driving thin film transistor can be prevented or reduced. Thus, the flicker phenomenon resulting from the use of the lower speed driving method may be prevented or reduced.

As the polycrystalline silicon has the characteristics of high mobility, by using the first thin film transistor as the driving thin film transistor of the organic light emitting diode display, the current amount supplied to the organic light emitting diode can be increased. Therefore, implementing the second thin film transistor T2 as the switching thin film transistor and the first thin film transistor T1 as the driving thin film transistor, the organic light emitting diode display may have lower power consumption and better video quality.

As the thin film transistor substrate according to the present invention provides for excellent video quality without or with less flicker even at a relatively low speed driving, it is very suitable for use in the mobile display or the wearable display. For example of a wearable wrist watch, the video data may be updated at every one second for reducing the power consumption. In that case, the frame frequency is 1 Hz. The display according to the present invention can provide for excellent video quality with little to no flicker even though the video data is driven at a low frequency, such as 1 Hz or lower. Further, for the mobile display or the wearable display, the frame rate for the still image can be lower so that the power consumption can be reduced without degrading the video quality. As a result, the video quality of the mobile display and/or wearable display can be improved, and the life time of the battery can be increased. In addition, the display according to the present invention can be applied to electric book devices (or "E-Books") whose data update period is very long to reduce power consumption without degrading the video quality.

At least one of the first and the second thin film transistors T1 and T2 may be embedded into a driver circuit, for example as shown in FIG. 7, in one or more of the data driver 200, the multiplexer (or "MUX") 210, and the gate driver 300, that form a driver circuit. This driver circuit writes and/or applies the data voltage to the pixel. In another example, any one of the first and the second thin film transistors T1 and T2 may be disposed within a pixel in the display area, and the other disposed in the driver circuit in the non-display area. The data driver 200 converts the input video data into the voltage values and output the voltage values. The multiplexer 210 may reduce the number of output channels of the data driver 200, by distributing the data voltages from the data driver 200 to the data lines DL by a time-sharing or time-division method. The gate driver 300 outputs the scan signal (or "gate signal") to the gate lines GL synchronized to the data voltage for sequentially selecting the pixel line where the data voltage is to be applied. To reduce the number of output channels of the gate driver 300, other multiplexers not shown in the figures may be further included between the gate driver 300 and the gate lines GL. The multiplexer 210 and the gate driver 300 may be formed on the same thin film transistor substrate with the pixel array 100, as shown in FIG. 7. The multiplexer 210 and the gate driver 300 may be disposed within the non-display area and the pixel array may be disposed within the display area of the thin film transistor substrate.

The thin film transistor substrate according to the present invention may be applied to any type of display requiring an active matrix thin film transistor substrate such as the liquid crystal display, the organic light emitting diode display and/or the electrophoresis display device. Hereinafter, more example embodiments providing for more applications for the display using the thin film transistor substrate according to the present invention.

Fifth Example Embodiment

Figure 8:
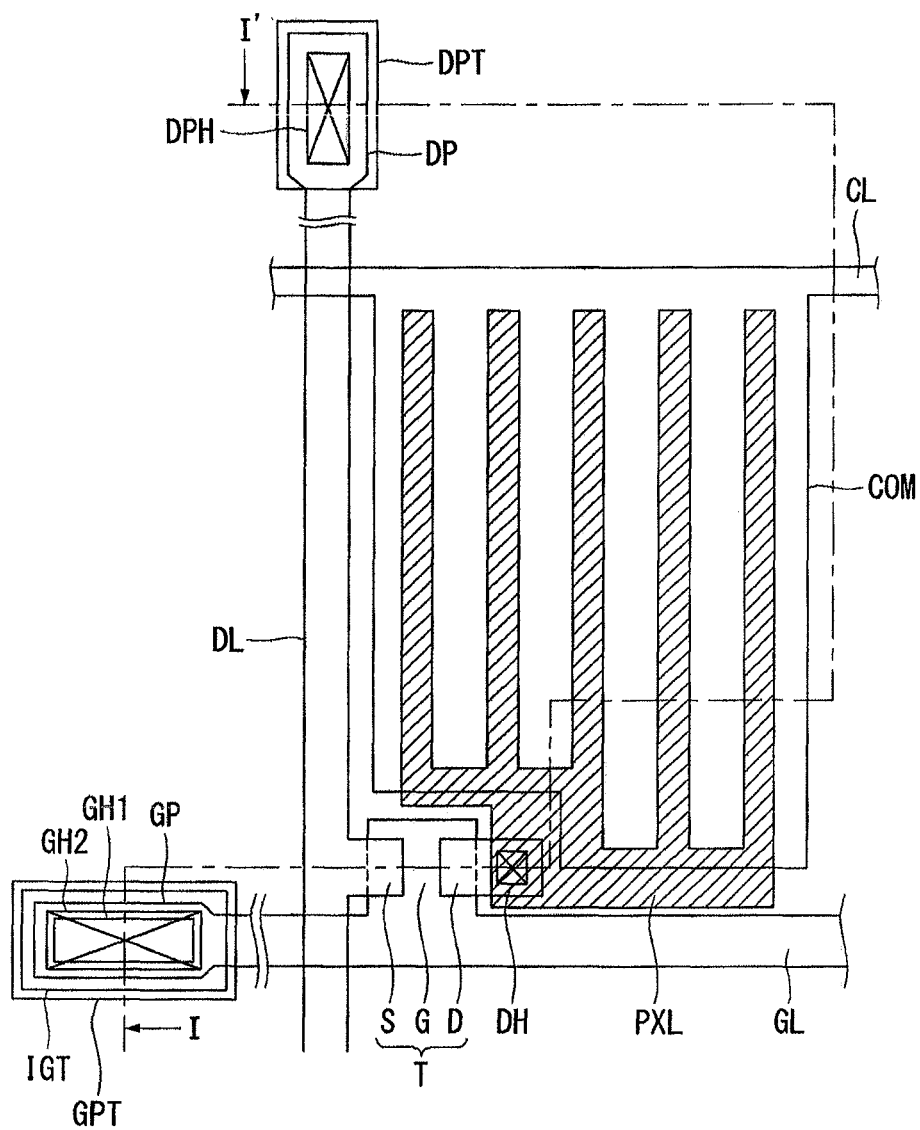
FIG. 8 is a plane view illustrating a thin film transistor substrate having an oxide semiconductor layer included in a fringe field type liquid crystal display according to a fifth example embodiment of the present invention.
Figure 9:
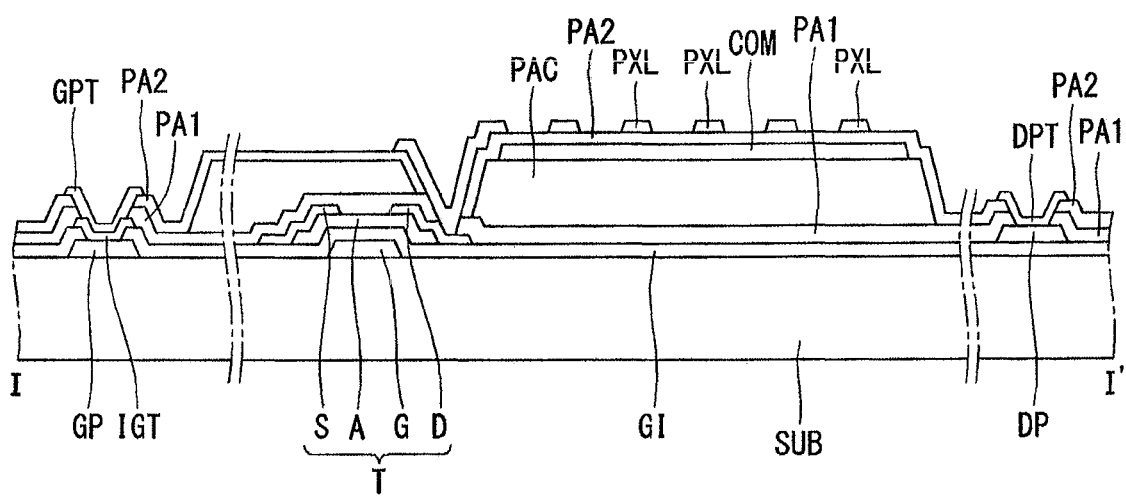
FIG. 9 is a cross-sectional view illustrating the structure of the thin film transistor substrate along line I-I' in FIG. 8, according to the fifth example embodiment of the present invention.

FIG. 8 is a plane view illustrating a thin film transistor substrate having an oxide semiconductor layer included in a fringe field type liquid crystal display according to the fifth example embodiment of the present invention. FIG. 9 is a cross-sectional view illustrating the structure of the thin film transistor substrate of FIG. 8 along line I-I' in FIG. 9, according to the fifth example embodiment of the present invention.

The thin film transistor substrate having a metal oxide semiconductor layer shown in FIGS. 8 and 9 comprises a gate line GL and a data line DL crossing each other with a gate insulating layer GI therebetween on a lower substrate SUB, and a thin film transistor T formed at the crossing portion. By the crossing structure of the gate line GL and the data line DL, a pixel area is defined.

The thin film transistor T comprises a gate electrode G branched (or "protruded") from the gate line GL, a source electrode S branched from the data line DL, a drain electrode D separated from the source electrode S, and a semiconductor layer A on the gate insulating layer GI and overlapping with the gate electrode G for forming a channel area between the source electrode S and the drain electrode D.

At one end of the gate line GL, a gate pad GP is disposed for receiving the gate signal. The gate pad GP is connected to a gate pad intermediate terminal IGT through the first gate pad contact hole GH1 penetrating the gate insulating layer GI. The gate pad intermediate terminal IGT is connected to the gate pad terminal GPT through the second gate pad contact hole GH2 penetrating the first passivation layer PA1 and the second passivation layer PA2. Further, at one end of the data line DL, a data pad DP is disposed for receiving the pixel signal. The data pad DP is connected to a data pad terminal DPT through the data pad contact hole DPH penetrating the first passivation layer PA1 and the second passivation layer PA2.

In the pixel area, a pixel electrode PXL and a common electrode COM are formed with the second passivation layer PA2 therebetween to form a fringe electric field. The common electrode COM is connected to the common line CL disposed in parallel with the gate line GL. The common electrode COM is supplied with a reference voltage (or "common voltage") via the common line CL. In another example, the common electrode COM may have the one sheet electrode shape which covers the whole surface of the substrate SUB except the drain contact hole DH portions. That is, covering over the data line DL, the common electrode COM can work as a shielding means for the data line DL.

The common electrode COM and the pixel electrode PXL can have various shapes and positions according to the design purpose and environment. While the common electrode COM is supplied with a reference voltage having a constant value, the pixel electrode PXL is supplied with a data voltage that varies according to the video data. Therefore, between the data line DL and the pixel electrode PXL, a parasitic capacitance may be formed. Due to the parasitic capacitance, the video quality of the display may be degraded. Therefore, the common electrode COM may be disposed first, and the pixel electrode PXL may be disposed over the common electrode COM.

In other words, on the first passivation layer PA1 covering the data line DL and the thin film transistor T, a planarization layer PAC is stacked by thickly depositing an organic material having a low permittivity. Then, the common electrode COM is formed on the planarization layer PAC. Then, after depositing the second passivation layer PA2 to cover the common electrode COM, the pixel electrode PXL overlapping the common electrode is formed on the second passivation layer PA2. In this structure, the pixel electrode PXL is far from the data line DL, separated by the first passivation layer PA1, the planarization layer PAC and the second passivation layer PA2, so that the parasitic capacitance between the data line DL and the pixel electrode PXL can be reduced. In another example, the pixel electrode PXL may be disposed first and the common electrode COM is disposed over the pixel electrode PXL.

The common electrode COM may have a rectangular shape corresponding to the pixel area. The pixel electrode PXL may have the shape of a plurality of segments. In particular, the pixel electrode PXL overlaps the common electrode COM with the second passivation layer PA2 therebetween. Between the pixel electrode PXL and the common electrode COM, a fringe electric field is formed. By this fringe electric field, the liquid crystal molecules arranged in a plane direction between the thin film transistor substrate and the color filter substrate may be rotated according to the dielectric anisotropy of the liquid crystal molecules. According to the rotation degree of the liquid crystal molecules, the light transmittance ratio of the pixel area may be changed so as to represent a desired gray scale.

In FIGS. 8 and 9 for explaining the fifth example embodiment of the present disclosure, for convenience, the thin film transistor T of the liquid crystal display is not shown in all possible detail. However, the first and/or the second thin film transistors T1 and/or T2 detailed in the first to fourth example embodiments of the present disclosure can be applied to this thin film transistor. For example, if a low speed driving is required, the second thin film transistor T2 having the oxide semiconductor material can be implemented as the thin film transistor T. For another example, if a low power consumption is required, the first thin film transistor T1 having the polycrystalline semiconductor material may be implemented as the thin film transistor T. For still another example, the thin film transistor T may be formed as including the first and the second thin film transistors T1 and T2 connected to each other so that the performance and the characteristics of both thin film transistors can compensate for and complement each other.

Sixth Example Embodiment

Figure 10:
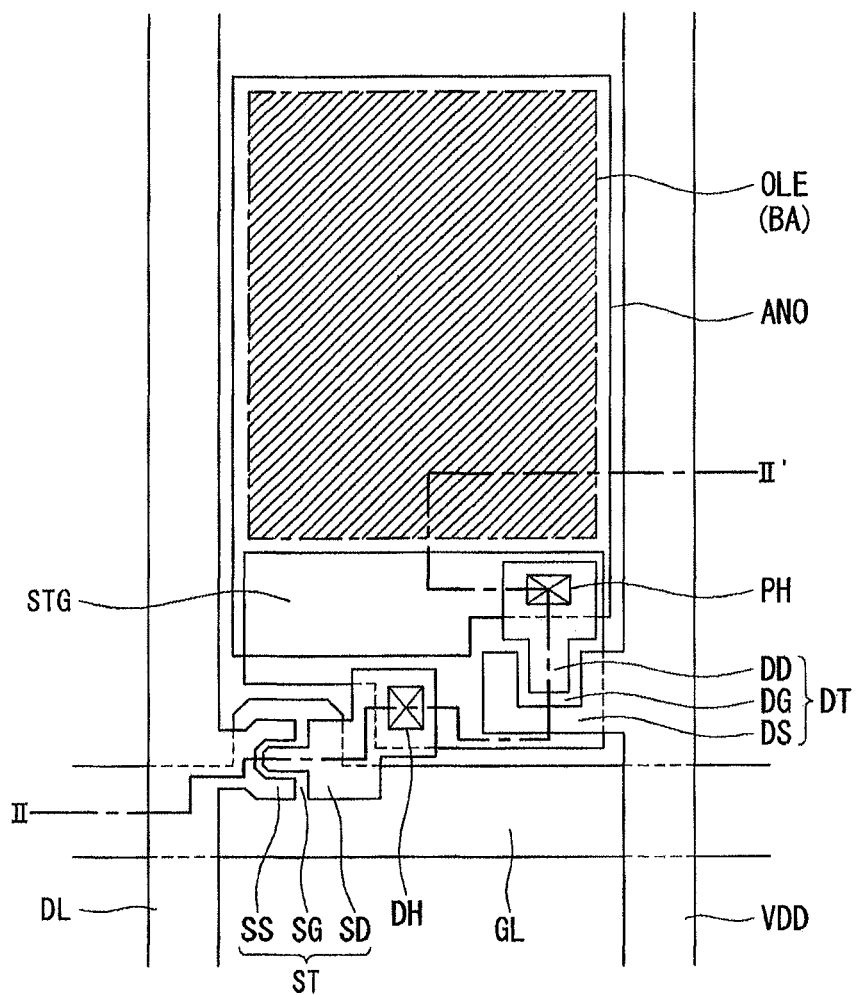
FIG. 10 is a plane view illustrating a structure of one pixel in an active matrix type organic light emitting diode display having active switching elements, such as thin film transistors, according to a sixth example embodiment of the present invention.
Figure 11:
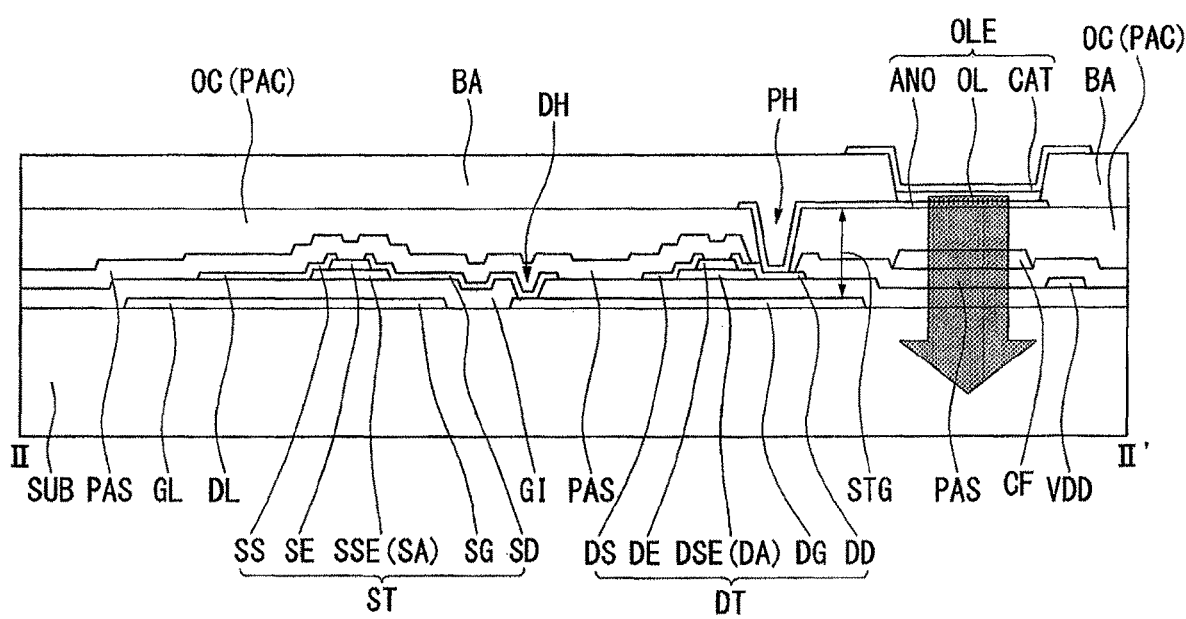
FIG. 11 is a cross sectional view illustrating the structure of the organic light emitting diode display along line II-II' in FIG. 10, according to the sixth example embodiment of the present invention.

FIG. 10 is a plane view illustrating the structure of one pixel for the active matrix type organic light emitting diode display having the active switching elements such as the thin film transistors according to a sixth example embodiment of the present invention. FIG. 11 is a cross sectional view illustrating the structure of the organic light emitting diode display along line II-II' in FIG. 10 according to the sixth example embodiment of the present disclosure.

As shown in FIGS. 10 and 11, the active matrix type organic light emitting diode display comprises a switching thin film transistor ST, a driving thin film transistor DT connected to the switching thin film transistor ST, and an organic light emitting diode OLE connected to the driving thin film transistor DT.

The switching thin film transistor ST is formed where a gate line GL and a data line DL cross each other on a substrate SUB. Supplying the data voltage from the data line DL to the gate electrode DG of the driving thin film transistor DT and to the storage capacitance STG in response to the scan signal, the switching thin film transistor ST serves a function of selects the pixel. The switching thin film transistor ST includes a gate electrode SG branching from the gate line GL, a semiconductor channel layer SA overlapping with the gate electrode SG, a source electrode SS and a drain electrode SD. Controlling the amount of the current applied to the organic light emitting diode OLE of the pixel according to the gate voltage, the driving thin film transistor DT serves a function of driving the organic light emitting diode OLE disposed at the pixel selected by the switching thin film transistor ST.

The driving thin film transistor DT includes a gate electrode DG connected to the drain electrode SD of the switching thin film transistor ST, a semiconductor channel layer DA, a source electrode DS connected to the driving current line VDD, and a drain electrode DD. The drain electrode DD of the driving thin film transistor DT is connected to the anode electrode ANO of the organic light emitting diode OLE. Between the anode electrode ANO and the cathode electrode CAT, an organic light emitting layer OL is disposed. The cathode electrode CAT is connected to the ground line Vss (not shown).

As shown in FIG. 11 in more detail, on the substrate SUB of the active matrix organic light emitting diode display, the gate electrodes SG and DG of the switching thin film transistor ST and the driving thin film transistor DT, respectively are disposed. On the gate electrodes SG and DG, the gate insulator GI is deposited. On the gate insulator GI overlapping with the gate electrodes SG and DG, the semiconductor layers SA and DA are disposed, respectively. On the semiconductor layers SA and DA, the source electrodes SS and DS and the drain electrodes SD and DD, respectively separated from the source electrodes SS and DS, are disposed. The drain electrode SD of the switching thin film transistor ST is connected to the gate electrode DG of the driving thin film transistor DT via the drain contact hole DH penetrating the gate insulator GI. The passivation layer PAS is deposited on the substrate SUB having the switching thin film transistor ST and the driving thin film transistor DT.

A color filer CF is disposed at the area where the anode electrode ANO is to be disposed. The color filter CF may have as large of an area as possible. For example, the color filter may overlap with as large of a portion of the data line DL, the driving current line VDD and/or the gate line GL as possible. The upper surface of the substrate having these thin film transistors ST and DT and color filters CF may not be in even and/or smooth conditions, but in uneven and/or rugged conditions having many steps. In order for the organic light emitting diode display to have good luminescent quality over the whole display area, the organic light emitting layer OL should have an even or smooth surface. So, to make the upper surface more planar and even, the planar layer PAC or the over coat layer OC may be deposited on the whole surface of the substrate SUB.

Then, on the over coat layer OC, the anode electrode ANO of the organic light emitting diode OLED is disposed. Here, the anode electrode ANO is connected to the drain electrode DD of the driving thin film transistor DT through the pixel contact hole PH penetrating the over coat layer OC and the passivation layer PAS.

On the substrate SUB having the anode electrode ANO, a bank (or a "bank pattern") BA is disposed over the area having the switching thin film transistor ST, the driving thin film transistor DT, and the various lines DL, GL and VDD for defining the pixel area. The portion of the anode electrode ANO exposed by the bank BA would be the light emitting area.

On the anode electrode ANO exposed from the bank BA, the organic light emitting layer OL is deposited. On the organic light emitting layer OL, the cathode electrode ACT is deposited. For an example in which the organic light emitting layer OL has a material emitting white light, each pixel can represent various colors by the color filter CF disposed under the anode electrode ANO. The organic light emitting diode display as shown in FIG. 11 is the bottom emission type display in which the visible light is radiated toward the bottom direction of the display substrate.

Between the gate electrode DG of the driving thin film transistor DT and the anode electrode ANO, a storage capacitance STG may be formed. By being connected to the driving thin film transistor DT, the storage capacitance STG keeps the voltage supplied to the gate electrode DG of the driving thin film transistor DT from the switching thin film transistor ST stable.

By using the thin film transistor substrate according to the present invention and example embodiments as detailed above, an active type flat panel display having good properties can be provided. In particular, to provide for excellent driving properties, the active layer of the thin film transistor may include a metal oxide semiconductor material.

The metal oxide semiconductor material may have its characteristics degraded when it operates while being exposed to the light for a long time. Therefore, a structure may be included to block the light from entering the thin film transistor having a metal oxide semiconductor material from below or above the thin film transistor. For example, for the thin film transistor substrates detailed above, the thin film transistors may be formed in the bottom gate structure. That is, the light introduced from the outside of substrate, especially from the lower side of the substrate, can be blocked by the gate electrode G including an opaque metal material.

The thin film transistor substrate for the flat panel display has a plurality of pixel areas disposed in a matrix form. Further, each pixel area includes at least one thin film transistor. That is, over the whole substrate, a plurality of thin film transistors is disposed. Because the plurality of pixel areas and the plurality of thin film transistors are used for the same purpose and should have the same quality and characteristics, they have the same structure.

However, in some cases, it may be desirable or necessary to provide the thin film transistors with different characteristics. For an example of the organic light emitting diode display, in one pixel area, at least one switching thin film transistor ST and at least one driving thin film transistor DT is disposed. As the respective purposes of the switching thin film transistor ST and the driving thin film transistor DT are different from each other, their required characteristics are also different from each other. To accommodate these differences, the switch thin film transistor ST and the driving thin film transistor DT may have the same basic structure and the same semiconductor material, but their channel layers may have different sizes for optimizing their respective characteristics. Otherwise, a compensating thin film transistor may further be included for supporting any specific functions or properties of any thin film transistor.

In FIGS. 10 and 11 for explaining the sixth example embodiment of the present invention, for convenience, the switching thin film transistor ST and the driving thin film transistor DT of the organic light emitting diode display are not shown with all possible detail. However, the first and/or the second thin film transistors T1 and/or T2 detailed in the first to fourth example embodiments of the present invention can be applied to the thin film transistors ST and DT. For example, the second thin film transistor T2 having the oxide semiconductor material can be implemented as the switching thin film transistor ST. Also, the first thin film transistor T1 having the polycrystalline semiconductor material may be implemented as the driving thin film transistor DT. Therefore, by including the first and the second thin film transistors T1 and T2 on one substrate, their performance and the characteristics can compensate for and complement each other.

Seventh Example Embodiment

For still another example embodiment, a driver element (e.g., a "driver IC") may be formed in the non-display area of the same thin film transistor substrate for the flat panel display as the pixel areas. Hereinafter, with reference to FIGS. 12 and 13, the thin film transistor substrate having the driver IC on the same substrate as the pixel areas.

Figure 12:
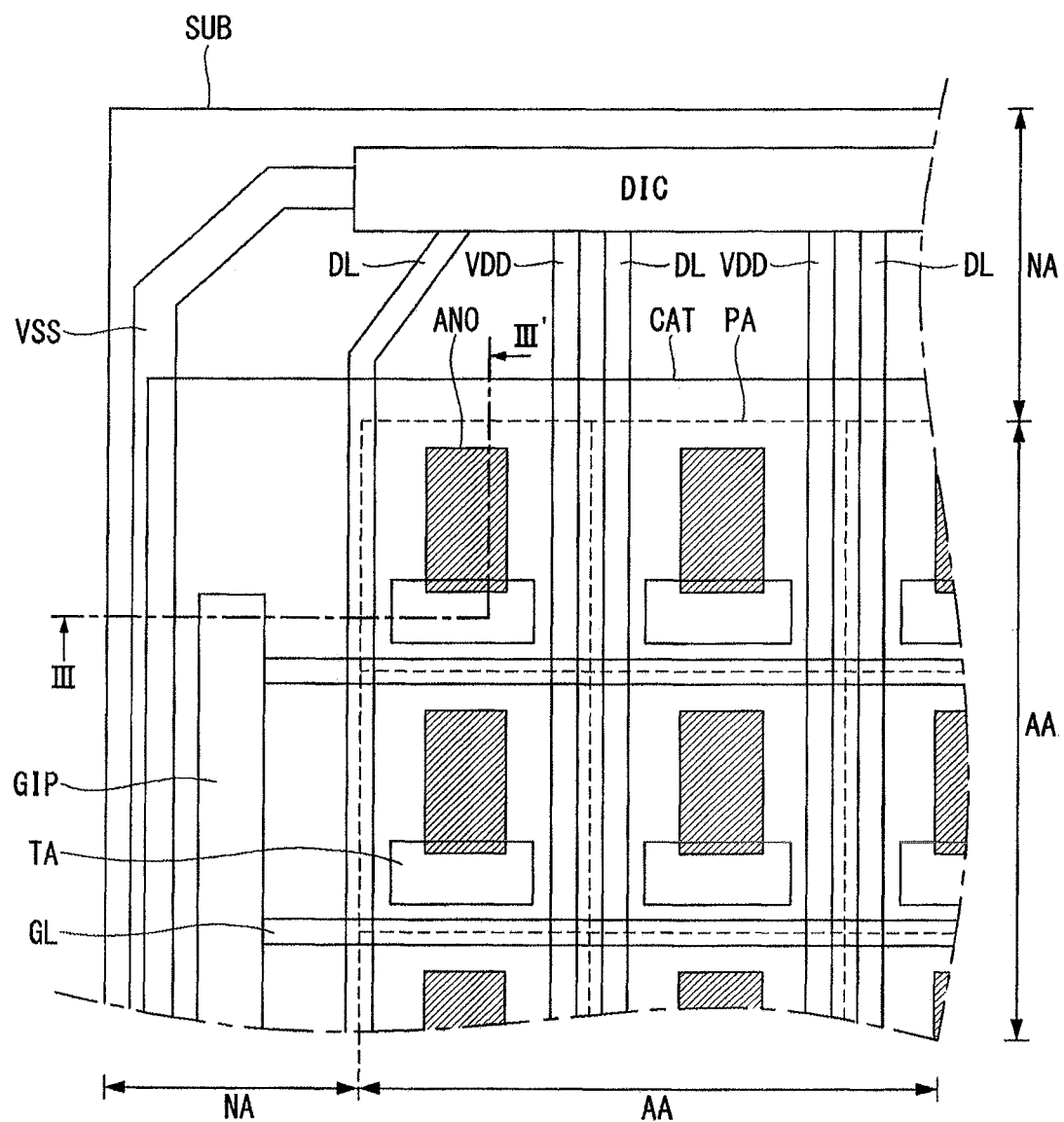
FIG. 12 is an enlarged plane view illustrating a structure of an organic light emitting diode display according to a seventh example embodiment of the present invention.
Figure 13:
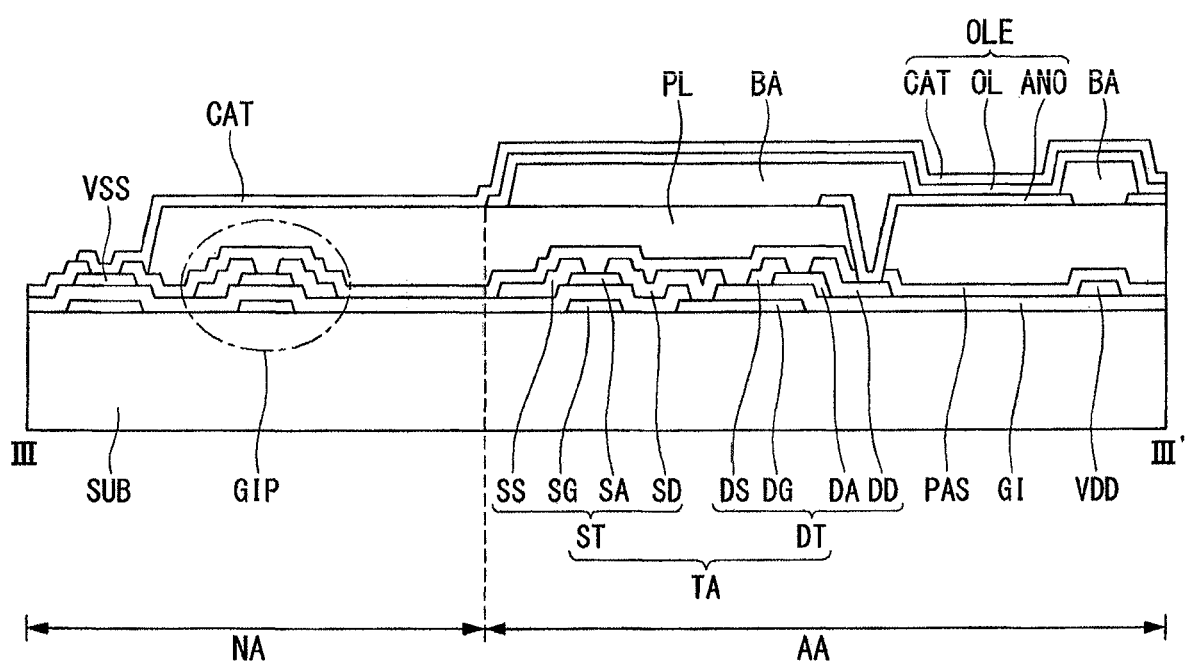
FIG. 13 is a cross sectional view illustrating a structure of the organic light emitting diode display along line in FIG. 12, according to the seventh example embodiment of the present invention.

FIG. 12 is an enlarged plane view illustrating a structure of an organic light emitting diode display according to a seventh example embodiment of the present invention. FIG. 13 is a cross sectional view illustrating a structure of the organic light emitting diode display along line in FIG. 12, according to the seventh example embodiment of the present invention. Here, for the discussion focuses more on the driver element embedded in the thin film transistor substrate that also includes display elements, the detailed features of the thin film transistors and the organic light emitting diode in the pixel areas already discussed above may be omitted.

First, with reference to FIG. 12, the plane structure of the organic light emitting diode display according to the seventh example embodiment is discussed in detail. An organic light emitting diode display according to the seventh example embodiment comprises a base substrate SUB including a display area AA for displaying the video information and a non-display area NA having various elements for driving the elements in the display area AA. In the display area AA, a plurality of pixel areas PA disposed in a matrix form is defined. In FIG. 12, the pixel areas PA are illustrated with the dotted lines.

For example, the pixel areas PA can be defined as an N (row)×M (column) matrix. However, the disposed pattern is not restricted to this particular form, and may have various different shapes and forms. Each of the pixel areas PA may have the same size or a different size. With one unit pixel having at least three sub pixels including red (R), green (G) and blue (B) sub pixels, the unit pixels may be uniformly disposed. In a simple sense, the pixel areas PA can be defined by the crossing of a plurality of gate lines GL running in a horizontal direction and a plurality of data lines DL running in a vertical direction.

In the non-display area NA defined as the peripheral area surrounding the pixel area PA, a data driving integrated circuit DIC for supplying the video data to the data lines DL and a gate driving integrated circuit GIP for supplying the scan signal to the gate lines GL are disposed. For an example of a display panel with a higher resolution than the VGA, in which more data lines DL and more driving current lines VDD are required, the data driving integrated circuit DIC may be installed external to the substrate SUB, and data contact pads may be disposed on the substrate SUB instead of the data driving integrated circuit DIC.

To simply show the structure of the display, the gate driving integrated circuit GIP is formed on one side portion of the substrate SUB directly. The ground line Vss for supplying the ground voltage may be disposed at an outer portion of the substrate SUB. The ground line Vss is disposed as to receive the ground voltage from external device located out of the substrate SUB, and to supply the ground voltage to the data driving integrated circuit DIC and the gate driving integrated circuit GIP. For example, the ground line Vss may be linked to the data driving integrated circuit DIC disposed at the upper side of the substrate SUB and to the gate driving integrated circuit GIP disposed at the right side and/or left side of the substrate SUB so as to surround the substrate SUB.

At each pixel area PA, the main elements such as an organic light emitting diode and thin film transistors for driving the organic light emitting diode are disposed. The thin film transistor is disposed at the thin film transistor area TA defined at one side of the pixel area PA. The organic light emitting diode includes an anode electrode ANO, a cathode electrode CAT and an organic light emission layer OL disposed between these two electrodes. The actual emission area is decided by the area of the organic light emission layer OL overlapping the anode electrode ANO.

The anode electrode ANO has a shape to occupy a portion of the pixel area PA and is connected to the thin film transistor formed in the thin film transistor area TA. The organic light emission layer OL is deposited on the anode electrode ANO. The cathode electrode CAT is deposited on the organic light emission layer OL so as to cover the whole surface of the display area AA having the pixel areas PA.

The cathode electrode CAT may go over the gate driving integrated circuit GIP and contact the ground line Vss disposed at the outer portion of the substrate SUB. In other words, the ground voltage can be supplied to the cathode electrode CAT through the ground line Vss. The cathode electrode CAT receives the ground voltage, and the anode electrode ANO receives the voltage corresponding to the video data. Based on the voltage difference between the cathode electrode CAT and the anode electrode ANO, the organic light emission layer OL radiates the light to represent the video information.

With further reference to FIG. 13, the cross-sectional structure of the organic light emitting diode display according to the seventh example embodiment is discussed in detail. On the substrate SUB, a non-display area NA and a display area AA are defined. The non-display area NA includes the gate driving integrated circuit GIP and the ground line Vss. The display area AA includes a switching thin film transistor ST, a driving thin film transistor DT, and an organic light emitting diode OLE.

The gate driving integrated circuit GIP has thin film transistors which are formed when the switching thin film transistor ST and the driving thin film transistor DT are formed. The switching thin film transistor ST in the pixel area PA has a gate electrode SG, a gate insulating layer GI, a channel layer SA, a source electrode SS and a drain electrode SD. In addition, the driving thin film transistor DT has a gate electrode DG connected to the drain electrode SD of the switching thin film transistor ST, the gate insulating layer GI, a channel layer DA, a source electrode DS and a drain electrode DD.

On the thin film transistors ST and DT, a passivation layer PAS and a planar layer PL are sequentially deposited. On the planar layer PL, an anode electrode ANO having a rectangular island shape within the pixel area PA is disposed. The anode electrode ANO connects to the drain electrode DD of the driving thin film transistor DT through the contact hole penetrating the passivation layer PAS and the planar layer PL.

On the substrate SUB having the anode electrode ANO, a bank BA is deposited to define the emission area. By patterning the bank BA, the most center portions of the anode electrode ANO are exposed. On the exposed anode electrode ANO, an organic light emission layer OL is deposited. By depositing a transparent conductive material on the bank BA and the organic light emission layer OL, the cathode electrode CAT is stacked. The organic light emitting diode OLED including the anode electrode ANO, the organic light emission layer OL and the cathode electrode CAT is disposed.

In an example in which the organic light emission layer OL may generate white light, color filters CF may be further included to represent full color video information. In that example, the organic light emission layer OL may be deposited to cover the whole surface of the display area AA.

The cathode electrode CAT may extend over the gate driving integrated circuit GIP so that it may cover the display area AA and the non-display area NA and contact the ground line Vss disposed at the outer portion of the substrate SUB. As a result, the ground voltage (or a reference voltage) can be supplied to the cathode electrode CAT via the ground line Vss.

In addition, the ground line Vss may be formed at the same layer and made of the same material as the gate electrodes SG and DG. In that case, the cathode electrode CAT can be connected to the ground line Vss through the contact hole penetrating the passivation layer PAS and the gate insulating layer GI over the ground line Vss. Otherwise, the ground line Vss may be formed at the same layer and made of the same material as the source and drain electrodes SS, SD, DD, and DD. In this case, the cathode electrode CAT can be connected to the ground line Vss through the contact hole penetrating the passivation layer PAS over the ground line Vss.

In FIGS. 12 and 13 for explaining the seventh example embodiment of the present invention, for convenience, the switching thin film transistor ST and the driving thin film transistor DT of the organic light emitting diode display are not shown in detail. However, the first and/or the second thin film transistors T1 and/or T2 detailed in the first to fourth example embodiments of the present invention can be applied to these thin film transistors. For example, the second thin film transistor T2 having the oxide semiconductor material can be implemented as the switching thin film transistor ST. The first thin film transistor T1 having the polycrystalline semiconductor material may be implemented as the driving thin film transistor DT. Further, for the gate driver IC GIP, the first thin film transistor T1 having the polycrystalline semiconductor material may be used. If required, for the gate driver IC GIP, the C-MOS type thin film transistor including P-MOS type and N-MOS type thin film transistors may be used.

While the embodiments of the present invention have been described in detail with reference to the drawings, it will be understood by those skilled in the art that the invention can be implemented in other specific forms without changing the technical principle or spirit, or essential features of the invention. Therefore, it should be noted that the forgoing embodiments are merely illustrative in all aspects and are not to be construed as limiting the invention. The scope of the invention is defined by the appended claims rather than the detailed description of the invention. All changes or modifications or their equivalents made within the meanings and scope of the claims should be construed as falling within the scope of the invention.

What is claimed is:

1. A display device, comprising:
   a substrate;
   a first gate insulating layer over the substrate;
   a second gate insulating layer over the substrate;
   a first thin film transistor including:
      a first semiconductor layer having a polycrystalline semiconductor material over the substrate, and
      a first gate electrode overlapping a portion of the first semiconductor layer, with the first gate insulating layer between the first semiconductor layer and the first gate electrode; and
   a second thin film transistor including:
      a second semiconductor layer including an oxide semiconductor material over the substrate, and
      a second gate electrode overlapping a portion of the second semiconductor layer, with the second gate insulating layer between the second semiconductor layer and the second gate electrode,
   wherein both the first gate electrode and the second gate electrode are respectively disposed directly on two separate parts of the second gate insulating layer, and
   wherein the second gate insulating layer of the second thin film transistor is formed discontinuously from the second gate insulating layer of the first thin film transistor.

2. The display device of claim 1, wherein the second gate insulating layer has a part disposed over the first gate insulating layer between the first gate electrode and the first semiconductor layer, and another part disposed between the second gate electrode and the second semiconductor layer.

3. The display device of claim 1, wherein the second semiconductor layer is disposed over the first gate insulating layer.

4. The display device of claim 1, further comprising an intermediate insulating layer over the first gate insulating layer, the first gate electrode, the second semiconductor layer, and the second gate electrode.

5. The display device of claim 1, wherein the first semiconductor layer includes a first channel area covered by the first gate electrode, a first source area at one side of the first channel area, and a first drain area at the other side of the first channel area, and
   wherein the second semiconductor layer includes a second channel area covered by the second gate electrode, a second source area at one side of the second channel area, and a second drain area at the other side of the second channel area.

6. The display device of claim 5,
   wherein the first thin film transistor further includes:
      a first source electrode over the intermediate insulating layer and connected to the first source area via a first contact hole through the intermediate insulating layer and the first gate insulating layer, and
      a first drain electrode over the intermediate insulating layer and connected to the first drain area via a second contact hole through the intermediate insulating layer and the first gate insulating layer; and
   wherein the second thin film transistor further includes:
      a second source electrode over the intermediate insulating layer and connected to the second source area via a third contact hole through the intermediate insulating layer, and
      a second drain electrode over the intermediate insulating layer and connected to the second drain area via a fourth contact hole through the intermediate insulating layer.

7. The display device of claim 1, further comprising:
   a driver circuit over the substrate; and
   at least one pixel area over the substrate,
   wherein one of the first thin film transistor and the second thin film transistor is disposed in the pixel area, and
   wherein the other of the first thin film transistor and the second thin film transistor is disposed in the driver circuit.

8. The device according to the claim 7, further comprising data lines and gate lines over the substrate,
   wherein the driver circuit includes:
      a data driver configured to output a data voltage,
      a multiplexer configured to distribute the data voltage from the data driver to the data lines, and
      a gate driver configured to output a scan pulse to the gate lines, and
   wherein the first thin film transistor is disposed in one or both of the multiplexer and the gate driver.

9. The display device of claim 1, wherein the display device is an organic light emitting diode display and further comprises a plurality of pixels on the substrate, each pixel including an organic light emitting diode,
   wherein the second thin film transistor is a switching element for selecting one of the pixels, and
   wherein the first thin film transistor is a driving element for driving the organic light emitting diode of the pixel selected by the second thin film transistor.

10. A display device, comprising:
    a substrate;

a first gate insulating layer over the substrate;
a second gate insulating layer over the first gate insulating layer;
a first thin film transistor on the substrate, and including a first gate electrode and a first semiconductor layer having a polycrystalline semiconductor material; and
a second thin film transistor on the substrate, and including a second gate electrode and a second semiconductor layer having an oxide semiconductor material,
wherein both the first gate insulating layer and the second gate insulating layer are disposed between the first gate electrode and the first semiconductor layer,
wherein only the second gate insulating layer is disposed between the second gate electrode and the second semiconductor layer, and
wherein both the first gate electrode and the second gate electrode are respectively disposed directly on two separate parts of the second gate insulating layer.

11. The display device of claim 10, wherein the first semiconductor layer includes a first channel area, a first source area at one side of the first channel area, and a first drain area at the other side of the first channel area, the first gate electrode overlapping the first channel area, and
wherein the second semiconductor layer includes a second channel area, a second source area at one side of the second channel area, and a second drain area at the other side of the second channel area, the second gate electrode overlapping the second channel area.

12. The display device of claim 11, wherein the second gate insulating layer is disposed over the first gate insulating layer between the first gate electrode and the first channel area.

13. The display device of claim 11, further comprising an intermediate insulating layer over the first gate electrode, the first gate insulating layer, and the second gate electrode.

14. The display device of claim 13, wherein the first thin film transistor further includes:
a first source electrode on the intermediate insulating layer and connected to the first source area via a first contact hole through the intermediate insulating layer and the first gate insulating layer, and
a first drain electrode on the intermediate insulating layer and connected to the first drain area via a second contact hole through the intermediate insulating layer and the first gate insulating layer; and
wherein the second thin film transistor further includes:
a second source electrode on the intermediate insulating layer and connected to the second source area via a third contact hole through the intermediate insulating layer, and
a second drain electrode on the intermediate insulating layer and connected to the second drain area via a fourth contact hole through the intermediate insulating layer.

15. The display device of claim 10, wherein both the first semiconductor layer and the second semiconductor layer are directly on a same underlying layer.

16. The display device of claim 15, wherein the first gate insulating layer has an island shape over the first semiconductor layer, and
wherein the second gate insulating layer has an island shape over the first channel region and between the first gate insulating layer and the first gate electrode.

17. The display device of claim 10, wherein the second semiconductor layer is disposed over the first gate insulating layer.

18. The display device of claim 17, wherein the second gate insulating layer has an island shape between the second gate electrode and the second semiconductor layer.

19. The display device of claim 10, wherein the display device is an organic light emitting diode display and further comprises a plurality of pixels on the substrate, each pixel including an organic light emitting diode,
wherein the second thin film transistor is a switching element for selecting one of the pixels, and
wherein the first thin film transistor is a driving element for driving the organic light emitting diode of the pixel selected by the second thin film transistor.

* * * * *